(12) United States Patent
Choi et al.

(10) Patent No.: US 12,190,807 B2
(45) Date of Patent: Jan. 7, 2025

(54) DISPLAY APPARATUS

(71) Applicant: SAMSUNG DISPLAY CO., LTD., Yongin-si (KR)

(72) Inventors: Jonghyun Choi, Yongin-si (KR); Minjeong Oh, Yongin-si (KR); Kijune Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 23 days.

(21) Appl. No.: 18/162,840

(22) Filed: Feb. 1, 2023

(65) Prior Publication Data
US 2023/0377518 A1 Nov. 23, 2023

(30) Foreign Application Priority Data

May 17, 2022 (KR) .................. 10-2022-0060450
Jul. 1, 2022 (KR) .................. 10-2022-0081495

(51) Int. Cl.
| | |
|---|---|
| G09G 5/00 | (2006.01) |
| G09G 3/3233 | (2016.01) |
| H10K 59/131 | (2023.01) |
| H10K 59/80 | (2023.01) |

(52) U.S. Cl.
CPC ......... G09G 3/3233 (2013.01); H10K 59/131 (2023.02); H10K 59/873 (2023.02); G09G 2300/0426 (2013.01); G09G 2300/0819 (2013.01); G09G 2300/0861 (2013.01)

(58) Field of Classification Search
CPC ......... G09G 3/3233; G09G 2300/0426; G09G 2300/0819; G09G 2300/0861; H10K 59/131; H10K 59/873

USPC .................. 345/204, 173, 174, 205, 206
See application file for complete search history.

(56) References Cited

U.S. PATENT DOCUMENTS

| | | | |
|---|---|---|---|
| 2019/0278145 A1 | 9/2019 | Tanaka et al. | |
| 2021/0091163 A1* | 3/2021 | Son .................. | H10K 59/123 |
| 2021/0183972 A1 | 6/2021 | Son et al. | |
| 2021/0202664 A1 | 7/2021 | Kim | |
| 2021/0384284 A1 | 12/2021 | Song et al. | |
| 2022/0052148 A1 | 2/2022 | Yu et al. | |
| 2022/0130933 A1* | 4/2022 | Yu .................. | H10K 59/1216 |
| 2022/0246074 A1* | 8/2022 | Xuan ............... | H01L 23/5226 |
| 2022/0320227 A1 | 10/2022 | Gao et al. | |

(Continued)

FOREIGN PATENT DOCUMENTS

| | | |
|---|---|---|
| CN | 113410279 A | 9/2021 |
| KR | 1020210074716 A | 6/2021 |

(Continued)

OTHER PUBLICATIONS

Extended European Search Report Dated Sep. 27, 2023, Issued in Corresponding European Application No. 23170994.0.

*Primary Examiner* — Thuy N Pardo
(74) *Attorney, Agent, or Firm* — CANTOR COLBURN LLP

(57) ABSTRACT

A display apparatus includes a substrate including a display area, a pixel circuit arranged in the display area of the substrate and including a wiring, a driving transistor, a compensation transistor, a first initialization transistor, and an emission control transistor, and a light-emitting element connected to the pixel circuit. A trench indented in a width direction of the wiring is defined in at least a portion of the wiring disposed inside the pixel circuit.

20 Claims, 17 Drawing Sheets

(56) References Cited

U.S. PATENT DOCUMENTS

| | | | | |
|---|---|---|---|---|
| 2022/0350432 A1* | 11/2022 | Takahashi | .......... | H10K 59/1213 |
| 2023/0354653 A1* | 11/2023 | Wang | .................. | H10K 59/131 |
| 2024/0014198 A1* | 1/2024 | Shin | .................... | H10K 50/844 |
| 2024/0065032 A1* | 2/2024 | Kang | .................. | H10K 59/123 |
| 2024/0130182 A1* | 4/2024 | Kim | ...................... | G01N 27/20 |

FOREIGN PATENT DOCUMENTS

| | | | |
|---|---|---|---|
| KR | 1020210083917 | A | 7/2021 |
| KR | 1020210152630 | A | 12/2021 |
| WO | 2022067648 | A1 | 4/2022 |

\* cited by examiner

DISPLAY APPARATUS

This application claims priority to Korean Patent Application No. 10-2022-0060450, filed on May 17, 2022, and No. 10-2022-0081495, filed on Jul. 1, 2022, and all the benefits accruing therefrom under 35 U.S.C. § 119, the content of which in their entirety is herein incorporated by reference.

BACKGROUND

1. Field

Embodiments relate to a display apparatus.

2. Description of the Related Art

Recently, a usage of display panels is being diversified. In addition, as display panels are becoming thinner and lighter, their range of use is gradually being extended.

As an area occupied by a display area of a display panel expands, elements are desired to be arranged in an outer region that is relatively narrow.

SUMMARY

In a case where cracks occur due to an arrangement of the elements, reliability of a display apparatus may be deteriorated, or a display quality may be deteriorated by the cracks.

Embodiments include a display apparatus with improved reliability and display quality.

Additional features will be set forth in part in the description which follows and, in part, will be apparent from the description, or may be learned by practice of the presented embodiments of the disclosure.

In an embodiment of the disclosure, a display apparatus includes a substrate including a display area, a pixel circuit arranged in the display area of the substrate and including a wiring, a driving transistor, a compensation transistor, a first initialization transistor, and an emission control transistor, and a light-emitting element connected to the pixel circuit. A trench indented in a width direction of the wiring is defined in at least a portion of the wiring disposed inside the pixel circuit.

In an embodiment, the display apparatus may further include a connection electrode connecting an emission control semiconductor layer of the emission control transistor to a pixel electrode of the light-emitting element. The emission control semiconductor layer of the emission control transistor may be connected to the connection electrode through a contact hole, and the trench may be provided in the wiring including a semiconductor layer disposed between an emission control gate electrode of the emission control transistor and the contact hole.

In an embodiment, the trench may be provided in the wiring including a semiconductor layer disposed between an emission control semiconductor layer of the emission control transistor and a driving semiconductor layer of the driving transistor.

In an embodiment, the trench may be provided in the wiring including a semiconductor layer disposed between a compensation semiconductor layer of the compensation transistor and a first initialization semiconductor layer of the first initialization transistor.

In an embodiment, the trench may include a first trench and a second trench. The first trench may be arranged in one side of the wiring, the second trench may be arranged in another side of the wiring, and the first trench may face the second trench.

In an embodiment, the display apparatus may further include a connection wiring arranged inside the pixel circuit, the semiconductor layer may be provided in plural, and the connection wiring may connect semiconductor layers apart from each other, and be disposed in a different layer from the semiconductor layers. The trench may be provided in the connection wiring.

In an embodiment, the display apparatus may further include a connection electrode connecting an emission control semiconductor layer of the emission control transistor to a pixel electrode of the light-emitting element, and connected to the emission control semiconductor layer through a contact hole, and a conductive layer disposed between an emission control gate electrode of the emission control transistor and the contact hole, and arranged to be apart with a preset interval from the emission control gate electrode in a plan view.

In an embodiment, the display apparatus may further include a connection electrode connecting an emission control semiconductor layer of the emission control transistor to a pixel electrode of the light-emitting element, and connected to the emission control semiconductor layer through a contact hole, and an inorganic insulating layer including a first groove defined between an emission control gate electrode of the emission control transistor and the contact hole.

In an embodiment, the display apparatus may further include a connection electrode connecting an emission control semiconductor layer of the emission control transistor to a pixel electrode of the light-emitting element, and connected to the emission control semiconductor layer through a contact hole, a first lower metal layer disposed between the substrate and the emission control semiconductor layer, and overlapping an emission control gate electrode of the emission control transistor, and a second lower metal layer disposed between the substrate and the emission control semiconductor layer, and overlapping the connection electrode.

In an embodiment, the display apparatus may further include a bridge wiring disposed in a different layer from an emission control semiconductor layer of the emission control transistor and connected to the emission control semiconductor layer. A second groove may be provided in an inorganic insulating layer covering the bridge wiring, the second groove overlapping the bridge wiring.

In an embodiment, the display apparatus may further include an inorganic insulating layer arranged in the display area, and an organic insulating layer disposed between the inorganic insulating layer and the light-emitting element. The inorganic insulating layer may include a third groove surrounding the pixel circuit, and the organic insulating layer may fill the third groove.

In an embodiment of the disclosure, a display apparatus includes a substrate including a display area, a pixel circuit arranged on the substrate and including a driving transistor, a compensation transistor, a first initialization transistor, and an emission control transistor, an inorganic insulating layer arranged in the display area, a light-emitting element arranged on the inorganic insulating layer and connected to the pixel circuit, a connection electrode connecting an emission control semiconductor layer of the emission control transistor to a pixel electrode of the light-emitting element, and connected to the emission control semiconductor layer through a contact hole, and a conductive layer disposed between an emission control gate electrode of the emission control transistor and the contact hole, and arranged to be apart with a preset interval from the emission control gate electrode in a plan view.

In an embodiment, a first groove may be provided in the inorganic insulating layer, the first groove being disposed between the emission control gate electrode and the contact hole.

In an embodiment, the display apparatus may further include a first lower metal layer disposed between the substrate and the emission control semiconductor layer and overlapping the emission control gate electrode, and a second lower metal layer disposed between the substrate and the emission control semiconductor layer and overlapping the connection electrode.

In an embodiment, the display apparatus may further include an organic insulating layer disposed between the inorganic insulating layer and the light-emitting element. The inorganic insulating layer may include a third groove surrounding the pixel circuit, and the organic insulating layer may fill the third groove.

In an embodiment, the pixel circuit may further include a wiring and a trench indented in a width direction of the wiring may be defined in at least a portion of the wiring arranged inside the pixel circuit.

In an embodiment, the trench may be provided in the wiring including a semiconductor layer disposed between the emission control gate electrode and the contact hole.

In an embodiment, the trench may be provided in the wiring including a semiconductor layer disposed between the emission control semiconductor layer of the emission control transistor and a driving semiconductor layer of the driving transistor.

In an embodiment, the trench may be provided in the wiring including a semiconductor layer disposed between a compensation semiconductor layer of the compensation transistor and a first initialization semiconductor layer of the first initialization transistor.

In an embodiment, the trench may include a first trench and a second trench. The first trench may be arranged in one side of the wiring, the second trench may be arranged in another side of the wiring, and the first trench may face the second trench.

BRIEF DESCRIPTION OF THE DRAWINGS

The above and other features and advantages of predetermined embodiments of the disclosure will be more apparent from the following description taken in conjunction with the accompanying drawings, in which.

DETAILED DESCRIPTION

Figure 1A:
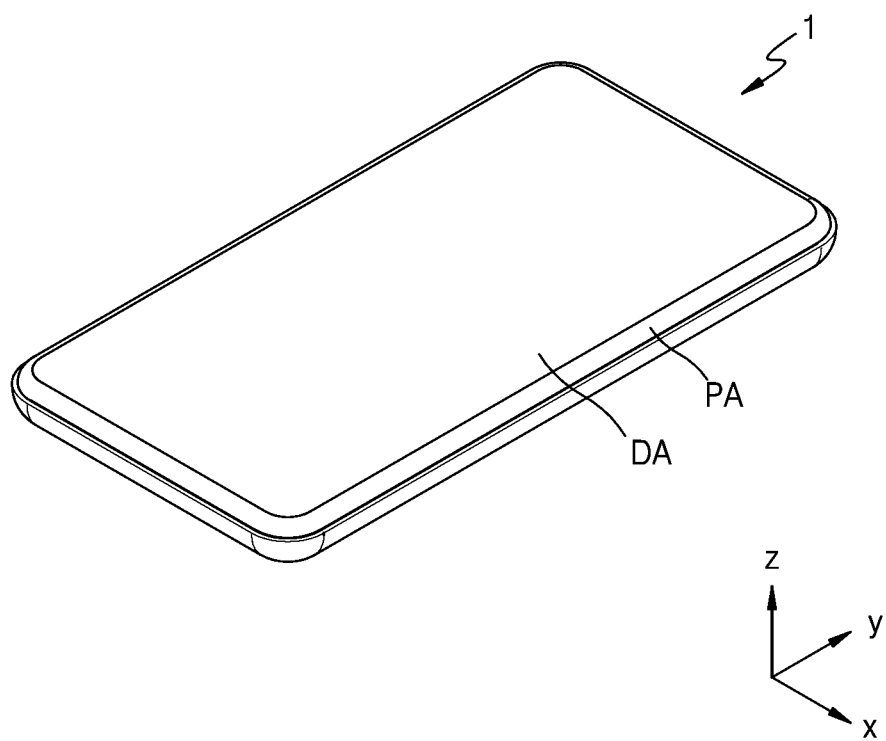
FIGS. 1A and 1B are schematic perspective views of an embodiment of a display apparatus.

Reference will now be made in detail to embodiments, examples of which are illustrated in the accompanying drawings, wherein like reference numerals refer to like elements throughout. In this regard, the illustrative embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the specification, "A and/or B" means A or B, or A and B. In the specification, "at least one of A and B" means A or B, or A and B.

Figure 1B:
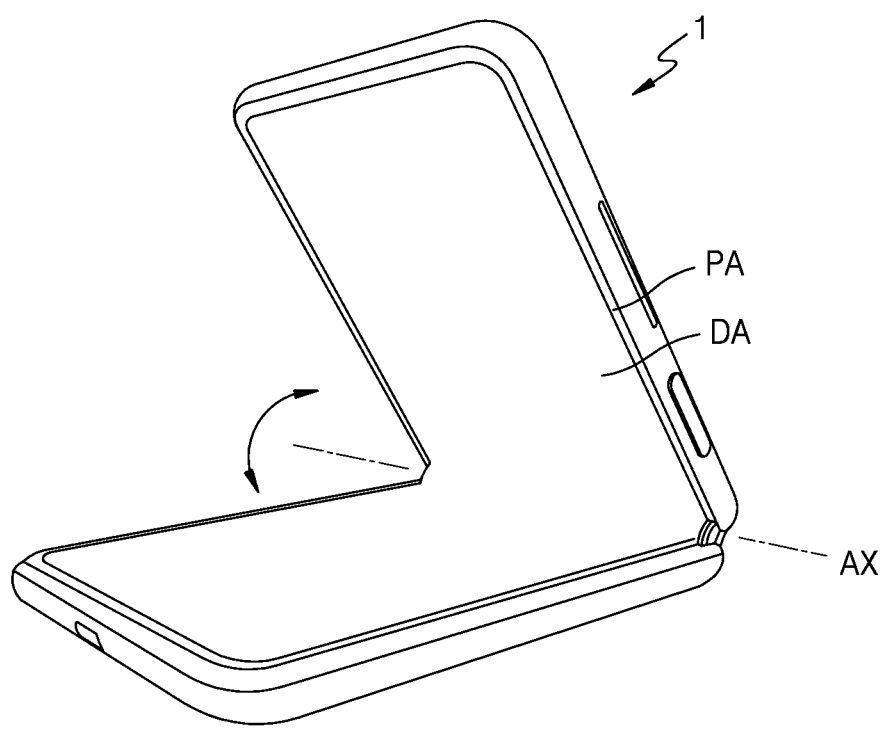

FIGS. 1A and 1B are schematic perspective views of an embodiment of a display apparatus 1.

Referring to FIGS. 1A and 1B, the display apparatus 1 is an apparatus for displaying moving images or still images and may include portable electronic apparatuses such as mobile phones, smart phones, tablet personal computers, mobile communication terminals, electronic organizers, electronic books, portable multimedia players ("PMP"), navigations, and ultra mobile personal computers ("UMPC"), or the like. In an alternative embodiment, the display apparatus 1 may be used as a display screen of various products including televisions, notebook computers, monitors, advertisement boards, Internet of things ("IoT"), or the like. In addition, the display apparatus 1 in an embodiment may be used in wearable devices including smartwatches, watchphones, glasses-type displays, and head-mounted displays ("HMD"). In addition, the display apparatus 1 in an embodiment may be used as instrument panels for automobiles, center fascias for automobiles, or center information displays ("CID") arranged on a dashboard, room mirror displays that replace side mirrors of automobiles, and displays arranged on the backside of front seats as an entertainment for back seats of automobiles. FIGS. 1A and 1B show, for convenience of description, the display apparatus 1 in an embodiment is used as a smartphone.

The display apparatus 1 may have a quadrangular (e.g., rectangular) shape in a plan view. In an embodiment, the display apparatus 1 may have a quadrangular shape including short sides of the x direction and long sides of the y direction in a plan view. A corner where the short side in the x direction meets the long side in the y direction may be round to have a preset curvature or formed to have a right angle. A planar shape of the display apparatus 1 is not limited to a rectangle, but may be other polygons, ellipses, or irregular shapes.

The display apparatus 1 may include a display area DA and a peripheral area PA outside the display area DA. The display area DA display images by light emitted from pixels. The display apparatus 1 may be carried in a bar type as shown in FIG. 1A, or carried in a foldable type as shown in FIG. 1B. In an embodiment, as shown in FIG. 1B, the display apparatus 1 may be folded around an axis AX crossing the display area DA.

Figure 2:
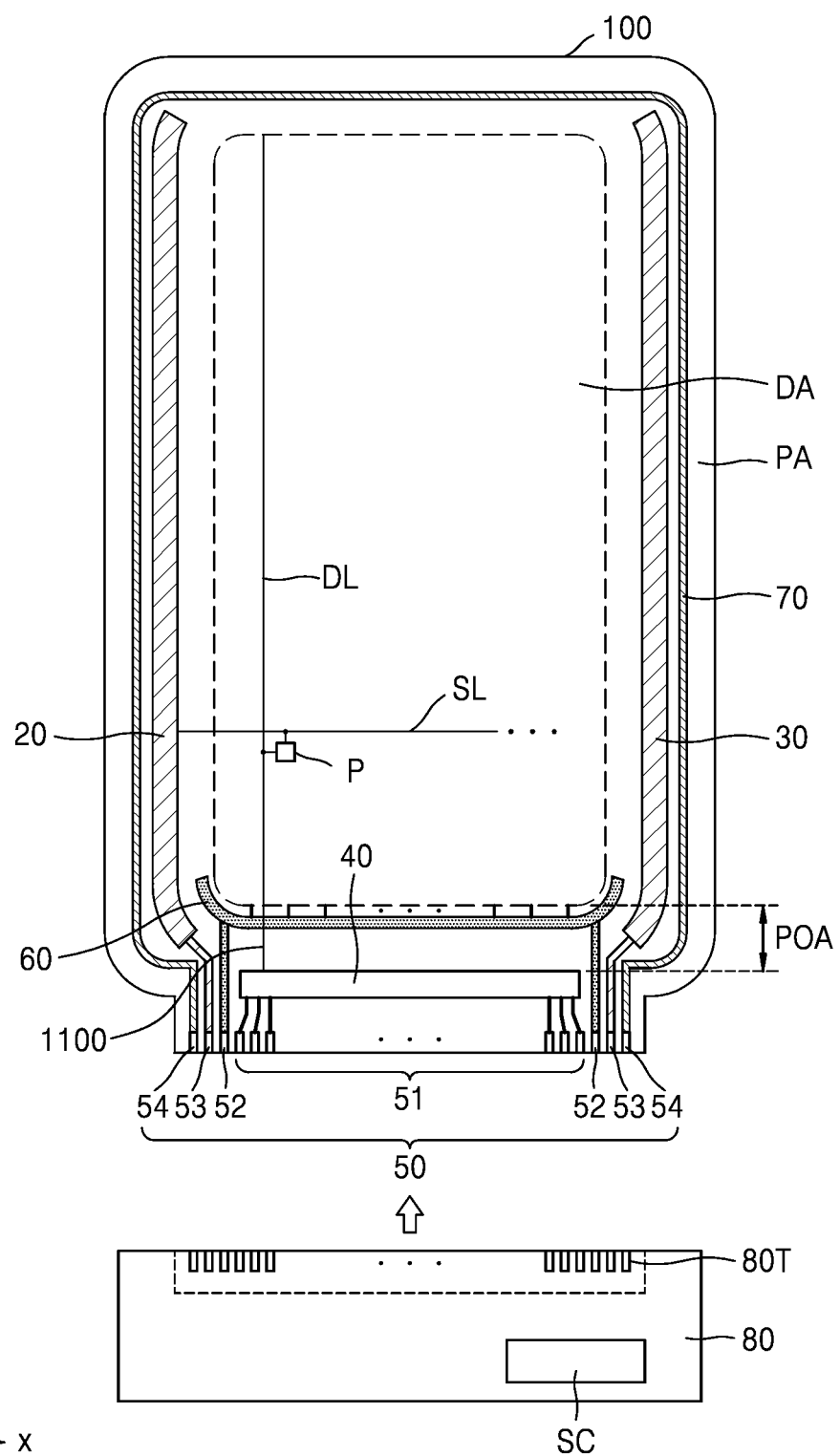
FIG. 2 is a schematic plan view of an embodiment of a display panel.

FIG. 2 is a schematic plan view of an embodiment of a display panel.

Referring to FIG. 2, in the display apparatus 1, pixels P arranged in the display area DA may emit red, green, and blue light by light-emitting elements (e.g., light-emitting diodes) arranged to relevant positions corresponding to respective pixels P. Transistors and signal lines, e.g., data lines DL and scan lines SL may be arranged in the display area DA. The transistors are electrically connected to the light-emitting elements, and the signal lines are electrically connected to storage capacitors. The data lines DL may extend in a y direction in the display area DA, and the scan lines SL may extend in an x direction in the display area DA.

The peripheral area PA may be outside the display area DA and may surround an entirety of the display area DA.

First and second scan drivers 20 and 30 may be arranged in the peripheral area PA and electrically connected to the scan lines SL. In an embodiment, some of the scan lines SL may be electrically connected to the first scan driver 20, and the rest may be connected to the second scan driver 30. The first and second scan drivers 20 and 30 may generate scan signals, and the generated scan signals may be transferred to a transistor electrically connected to a light-emitting element through the scan line SL.

The first and second scan drivers 20 and 30 may be respectively arranged on two opposite sides of the display area DA. In an embodiment, as shown in FIG. 2, the first scan driver 20 may be arranged on the left of the display area DA, and the second scan driver 30 may be arranged on the right of the display area DA. In another embodiment, one of the first and second drivers 20 and 30 may be omitted.

A driving voltage supply line 60 may be arranged in the peripheral area PA. The driving voltage supply line 60 may be arranged between one side (e.g., lower side in FIG. 2) of a substrate 110 (refer to FIGS. 7 to 11 and 13) in which a terminal section 50 is arranged, and the display area DA.

A common voltage supply line 70 may be arranged in the peripheral area PA and have a loop shape having one open side and extending along the display area DA. An entirety of the common voltage supply line 70 may have a U-shape as shown in FIG. 2. The common voltage supply line 70 may extend along other sides (e.g., left, right and upper sides in FIG. 2) except for the one side of the substrate 110 in which the terminal section 50 is arranged. Accordingly, the first scan driver 20 may be arranged between one portion of the common voltage supply line 70 and the display area DA, and the second scan driver 30 may be arranged between another portion of the common voltage supply line 70 and the display area DA.

An integrated circuit element 40 may be arranged in the peripheral area PA. The integrated circuit element 40 may be arranged between one side of the substrate 110 in which terminal section 50 is arranged, and the display area DA. The integrated circuit element 40 may include a data driver. In the specification, the integrated circuit element 40 may represent a data driver. The integrated circuit element 40 may be electrically connected to a pad electrode arranged therebelow. Data signals generated by the integrated circuit element 40, e.g., the data driver, may be transferred to a signal line arranged in the display area DA, e.g., the data line DL through a connection line 1100 arranged in a panout area POA. The panout area POA is a portion of the peripheral area PA and corresponds to a region between the integrated circuit element 40 and the display area DA.

The terminal section 50 may include terminals 51, 52, 53, and 54. The terminals 51, 52, 53, and 54 may be exposed by not being covered by an insulating layer and electrically connected to a controller SC arranged on a flexible printed circuit board 80. The flexible printed circuit board 80 may include counter terminals 80T corresponding to the terminal section 50. The counter terminals 80T of the flexible printed circuit board 80 may be electrically connected to the terminals 51, 52, 53, and 54. The controller SC may generate control signals for controlling the first and second scan drivers 20 and 30 and the integrated circuit element 40. The generated control signals may be transferred to the first and second scan drivers 20 and 30 and the integrated circuit element 40 through the terminals 51 and 53. The controller SC may transfer a driving voltage and a common voltage to the driving voltage supply line 60 and the common voltage supply line 70, respectively.

Figure 3A:
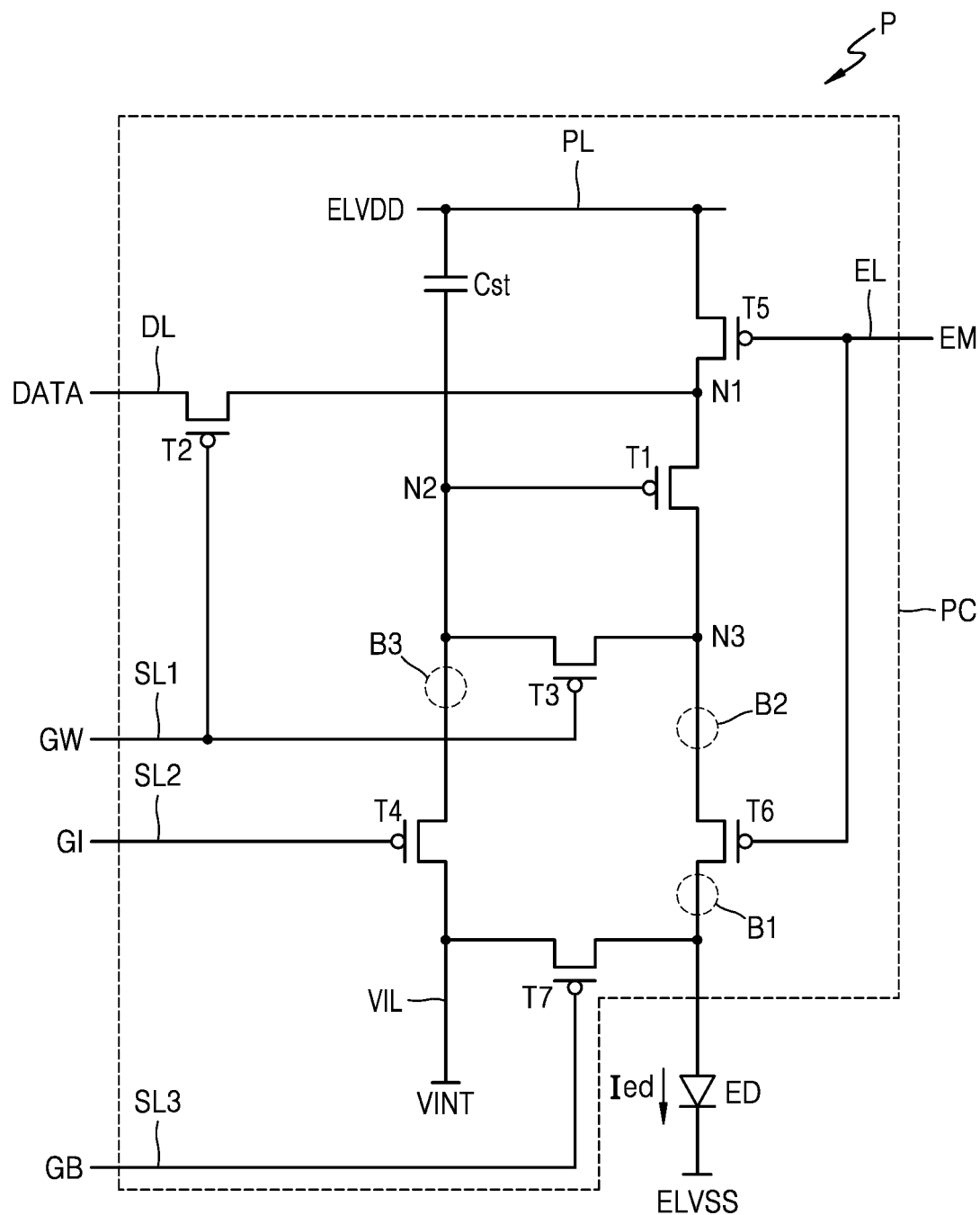
FIGS. 3A and 3B are schematic equivalent circuit diagrams of a pixel circuit which drives a light-emitting element provided in a display apparatus.
Figure 3B:
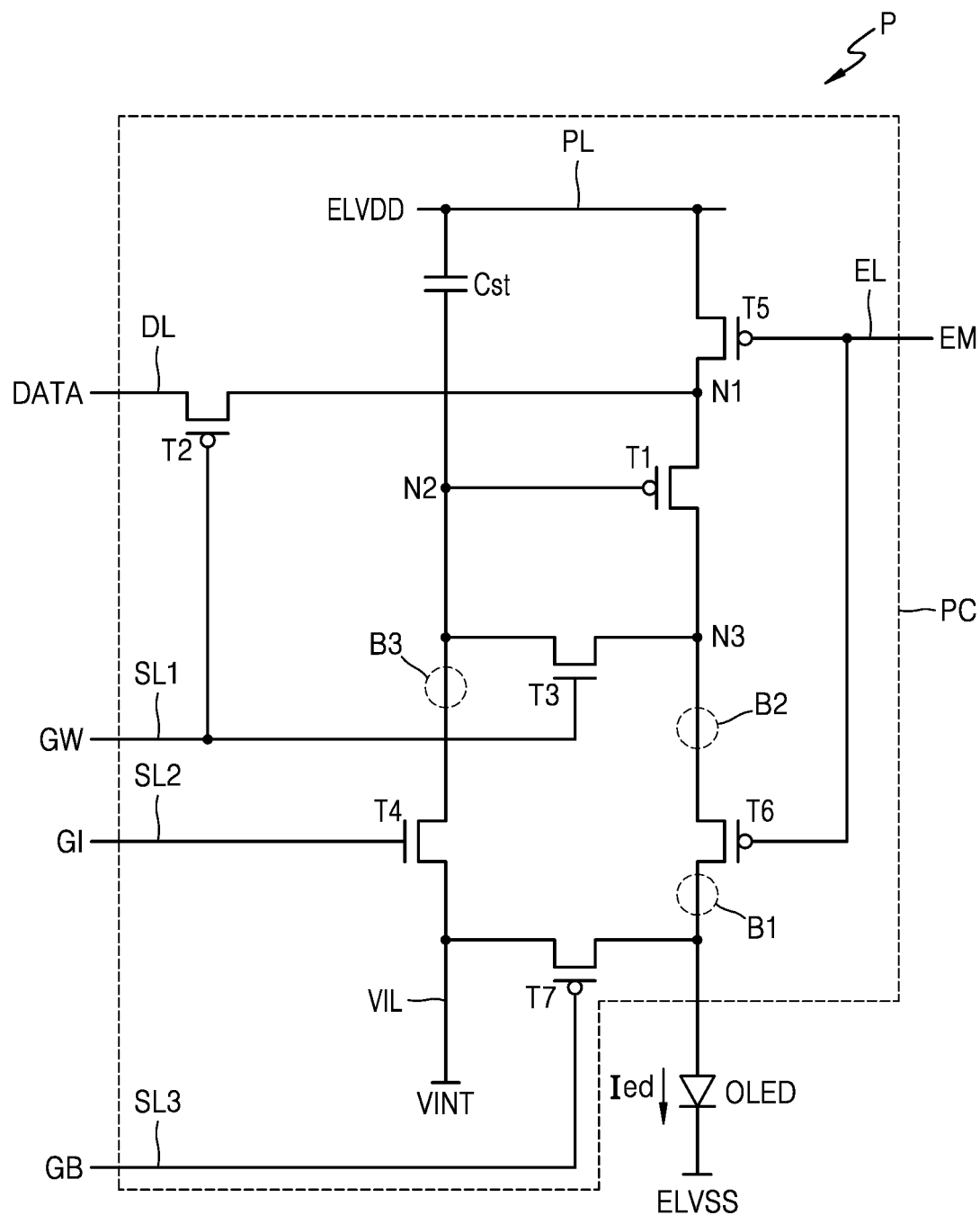

FIGS. 3A and 3B are schematic equivalent circuit diagrams of a pixel circuit which drives a light-emitting element disposed in the display apparatus. As described above with reference to FIG. 2, each pixel P may emit light by a light-emitting element (e.g., light-emitting diode) ED. The light-emitting element ED may be electrically connected to a pixel circuit PC.

Referring to FIG. 3A, the pixel circuit PC may include first to seventh transistors T1, T2, T3, T4, T5, T6, and T7. A first terminal of the transistor may be a source electrode or a drain electrode, and a second terminal may be an electrode different from the first terminal depending on the kind (an N type or a P type) of a transistor and/or an operation condition. In an embodiment, in the case where the first terminal is a source electrode, the second terminal may be a drain electrode.

The pixel circuit PC may be connected to a first scan line SL1, a second scan line SL2, a third scan line SL3, the emission control line EL, the data line DL, a driving voltage line PL, and an initialization voltage line VIL. The first scan line SL1 transfers first scan signals GW, the second scan line SL2 transfers second scan signals GI, the third scan line SL3 transfers third scan signals GB, the emission control line EL transfers emission control signals EM, the data line DL transfers data signals DATA, the driving voltage line PL transfers the driving voltage ELVDD, and the initialization voltage line VL transfers an initialization voltage VINT. In an embodiment, the second scan line SL2 and the third scan line SL3 may be connected to each other and provide the same signal. That is, in an embodiment, the second scan signal GI and the third scan signal GB may be the same signal.

The first transistor T1 (also referred to as a driving transistor) may be connected between the driving voltage line PL and the light-emitting element ED. The first transistor T1 may be connected between a first node N1 and a third node N3. The first transistor T1 may be connected to the driving voltage line PL through the fifth transistor T5, and electrically connected to the light-emitting element ED through the sixth transistor T6. The first transistor T1 includes a gate terminal, a first terminal, and a second terminal. The gate terminal is connected to a second node N2, the first terminal is connected to the first node N1, and the second terminal is connected to the third node N3. The driving voltage line PL may transfer a driving voltage ELVDD to the first transistor T1. The first transistor T1 serves as a driving transistor, receives a data signal DATA according to a switching operation of the second transistor T2 and supplies a driving current led to the light-emitting element ED.

The second transistor T2 (also referred to as a data-write transistor) may be connected between the data line DL and the first node N1. The second transistor T2 may be connected to the driving voltage line PL through the fifth transistor T5. The second transistor T2 may include a gate electrode, a first terminal, and a second terminal. The gate electrode is connected to the first scan line SL1, the first terminal is connected to the data line DL, and the second terminal is connected to the first node N1. The second transistor T2 may be turned on according to a first scan signal GW transferred through the first scan line SL1 and may perform a switching operation of transferring a data signal DATA to the first node N1. The data signal DATA is transferred through the data line DL.

The third transistor T3 (also referred to as a compensation transistor) may be connected between the second node N2 and the third node N3. The third transistor T3 may be connected to the light-emitting element ED through the sixth transistor T6. The third transistor T3 may include a gate electrode, a first terminal, and a second terminal. The gate electrode is connected to the first scan line SL1, the first terminal is connected to the second node N2, and the second terminal is connected to the third node N3. The third transistor T3 may be turned on according to a first scan signal GW to compensate for a threshold voltage of the first transistor T1 by diode-connecting the first transistor T1. The first scan signal GW is transferred through the first scan line SL1.

The fourth transistor T4 (also referred to as a first initialization transistor) may be connected between the second node N2 and the initialization voltage line VIL. The fourth transistor T4 may include a gate electrode, a first terminal, and a second terminal. The gate electrode is connected to the second scan line SL2, the first terminal is connected to the second node N2, and the second terminal is connected to the initialization voltage line VIL. The fourth transistor T4 may be turned on according to a second scan signal GI to initialize the gate voltage of the first transistor T1 by transferring the initialization voltage VINT to the gate electrode of the first transistor T1. The second scan signal GI is transferred through the second scan line SL2.

The fifth transistor T5 (also referred to as an operation control transistor) may be connected between the driving voltage line PL and the first node N1. The sixth transistor T6 (also referred to as an emission control transistor) may be connected between the third node N3 and the light-emitting element ED. The fifth transistor T5 may include a gate electrode, a first terminal, and a second terminal. The gate electrode is connected to the emission control line EL, the first terminal is connected to the driving voltage line PL, and the second terminal is connected to the first node N1. The sixth transistor T6 may include a gate electrode, a first terminal, and a second terminal. The gate electrode is connected to the emission control line EL, the first terminal is connected to the third node N3, and the second terminal is connected to a pixel electrode of the light-emitting element ED. The fifth transistor T5 and the sixth transistor T6 are simultaneously turned on according to an emission control signal EM, and a driving current flows through the light-emitting element ED. The emission control signal EM is transferred through the emission control line EL.

The seventh transistor T7 (also referred to as a second initialization transistor) may be connected between the light-emitting element ED and the initialization voltage line VIL. The seventh transistor T7 may include a gate electrode, a first terminal, and a second terminal. The gate electrode is connected to the third scan line SL3, the first terminal is connected to the second terminal of the sixth transistor T6 and the pixel electrode of the light-emitting element ED, and the second terminal is connected to the initialization voltage line VIL. The seventh transistor T7 may be turned on according to a third scan signal GB to initialize the pixel electrode of the light-emitting element ED by transferring the initialization voltage VINT to the pixel electrode of the light-emitting element ED. The third scan signal GB is transferred through the third scan line SL3.

The capacitor Cst may include a first electrode and a second electrode. The first electrode is connected to the gate electrode of the first transistor T1, and the second electrode is connected to the driving voltage line PL. The first capacitor Cst may maintain a voltage applied to the gate electrode of the first transistor T1 by storing and maintaining a voltage corresponding to a difference between voltages of two opposite ends of the gate electrode of the first transistor T1 and the driving voltage line PL.

The light-emitting element ED may include the pixel electrode (also referred to as a first electrode or an anode) and an opposite electrode (also referred to as a second electrode or a cathode). The opposite electrode may receive a common voltage ELVSS. The light-emitting element ED may display images by receiving the driving current from the first transistor T1 and emitting light.

It is shown in FIG. 3A that the first to seventh transistors T1, T2, T3, T4, T5, T6, and T7 are P-type transistors. However, the disclosure is not limited thereto. In an embodiment, the first to seventh transistors T1, T2, T3, T4, T5, T6, and T7 may be N-type transistors, or some of the first to seventh transistors T1, T2, T3, T4, T5, T6, and T7 may be N-type transistors, and the rest may be P-type transistors.

It is shown in FIG. 3B that the third transistor T3 and the fourth transistor T4 of the first to seventh transistors T1, T2, T3, T4, T5, T6, and T7 are N-type transistors, and the rest are P-type transistors. Here, the third transistor T3 and the fourth transistor T4 may include a semiconductor layer including an oxide, and the rest may include a semiconductor layer including silicon.

The light-emitting element in an embodiment may be various display elements such as an organic light-emitting element, an inorganic light-emitting element, or a quantum-dot light-emitting element.

Generally, when the display apparatus receives external impacts, as wirings inside the pixel circuit or terminals of the transistor may be short-circuited, a bright spot defect in which the light-emitting element is continuously turned on regardless of the driving of the pixel circuit may occur. This bright spot is easily visible, and may cause power consumption.

To darken these bright spots, embodiments provide a structure which may prevent the driving current from being transferred to the light-emitting elements in the case where external impacts occur.

In the pixel circuit PC of FIGS. 3A and 3B, in the case where at least one of a first region B1 between the second terminal of the sixth transistor T6 and the pixel electrode, a second region B2 between the first terminal of the sixth transistor T6 and the second terminal of the third transistor T3, and a third region B3 between the first terminal of the third transistor T3 and the second terminal of the fourth transistor T4 is cut off and disconnected, the driving current may not flow through the light-emitting element ED and the light-emitting element ED may be darkened.

Accordingly, the pixel circuit in embodiments employs a structure in which one of the first region B1, the second region B2, and the third region B3 is easily disconnected due to external impacts.

Figure 4:
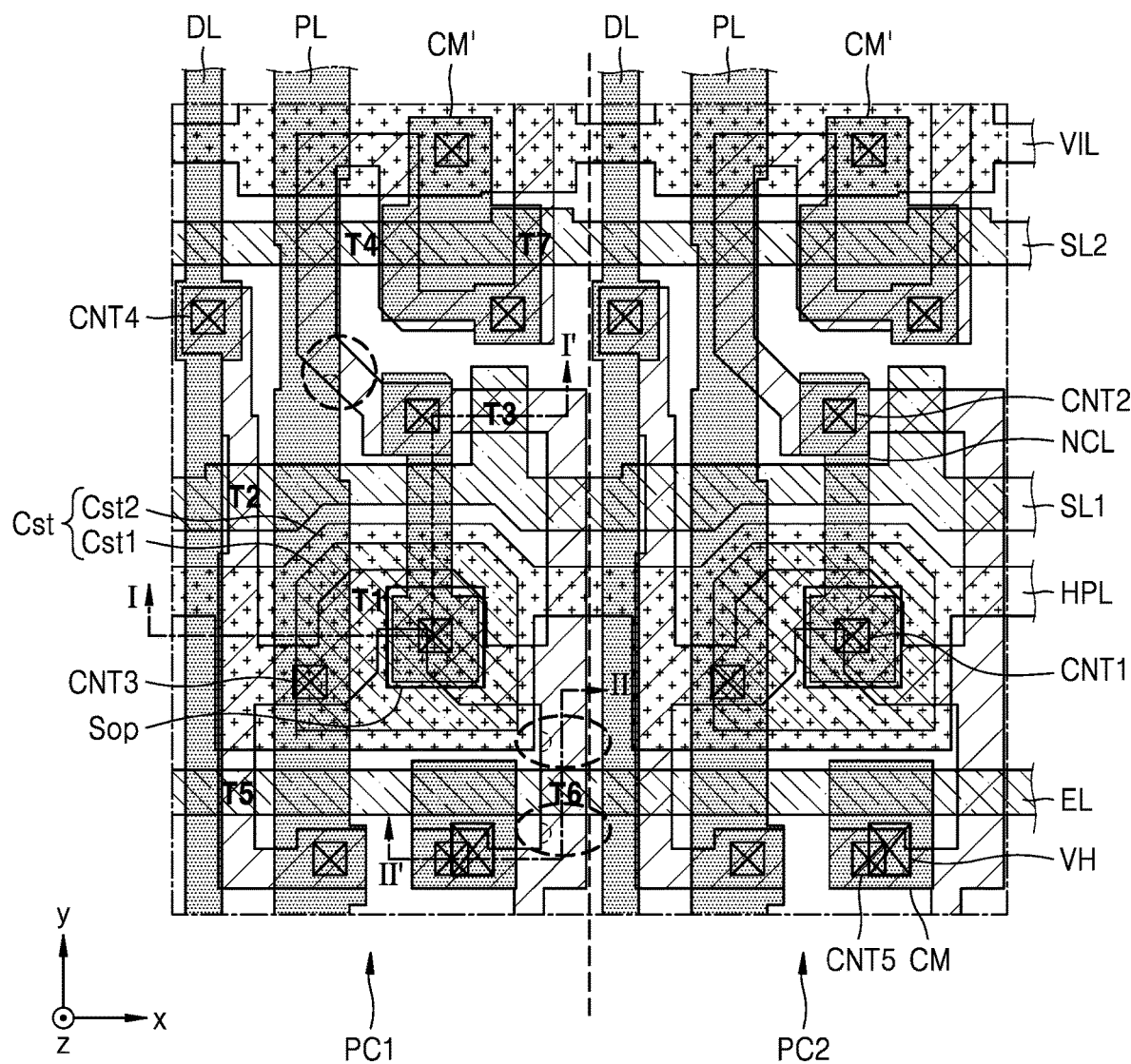
FIG. 4 is an arrangement view of two adjacent pixel circuits applicable to an embodiment.
Figure 5:
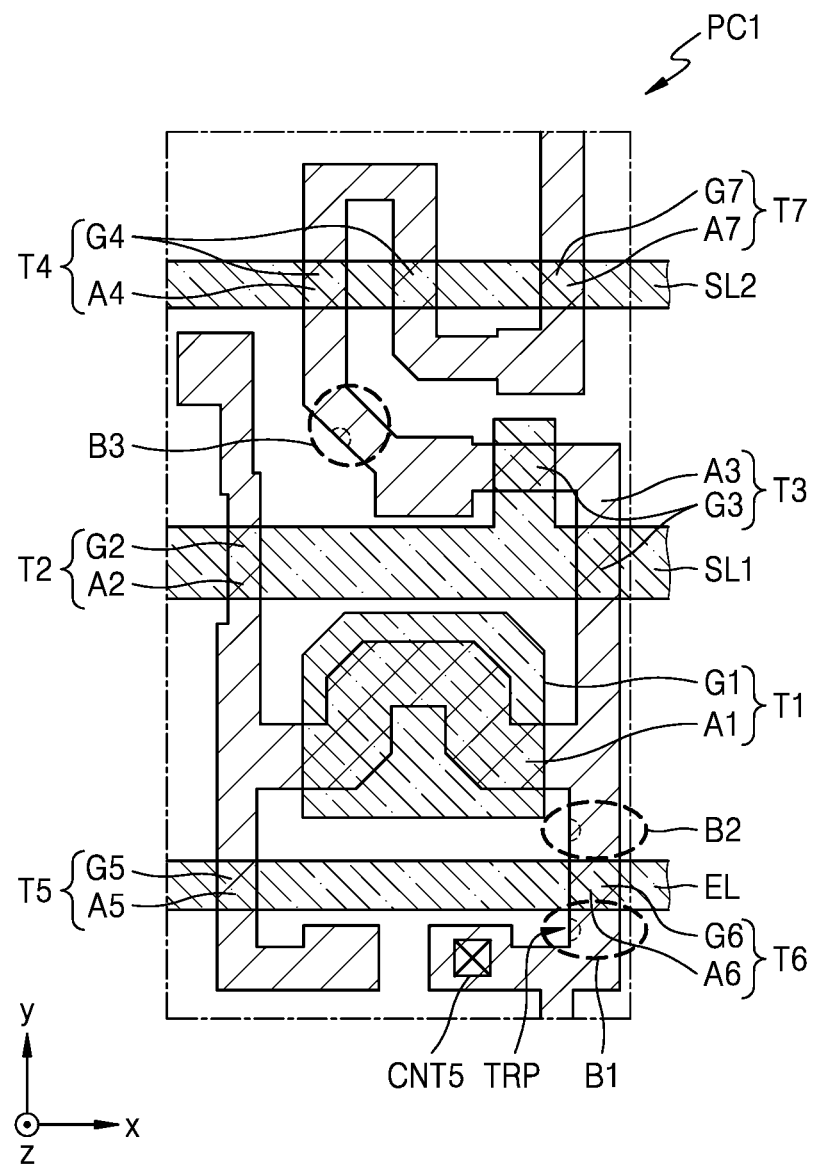
FIG. 5 is an extracted arrangement view of a semiconductor layer and a portion of a signal line among elements in FIG. 4.
Figure 6A:
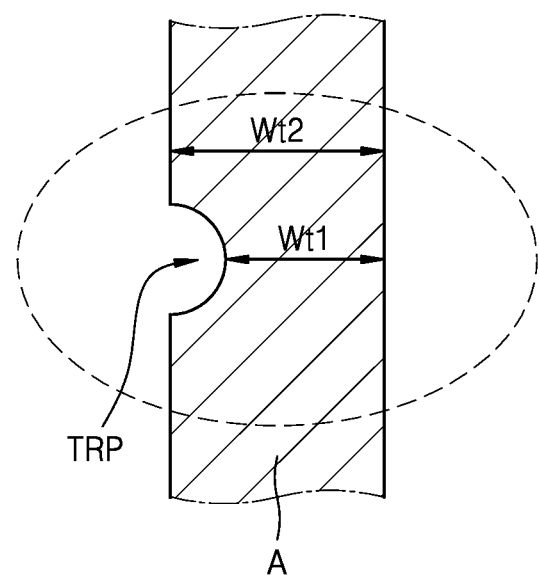
FIGS. 6A to 6C are enlarged views of a structure applicable to some regions in FIG. 4.
Figure 6B:
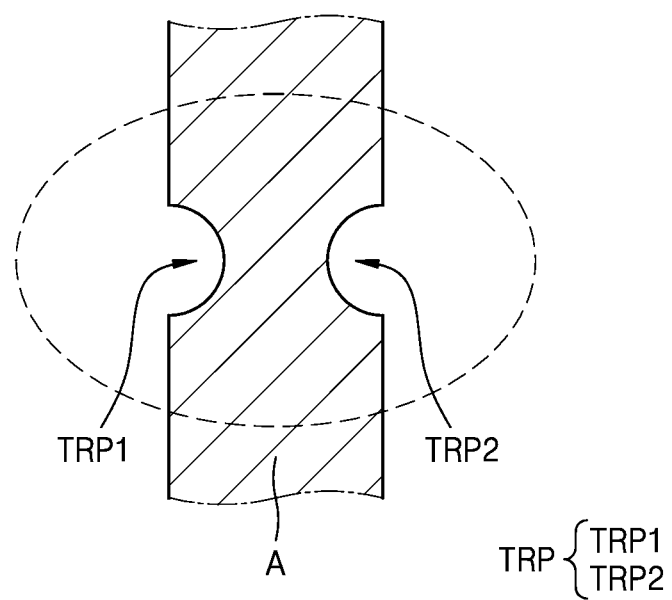
Figure 6C:
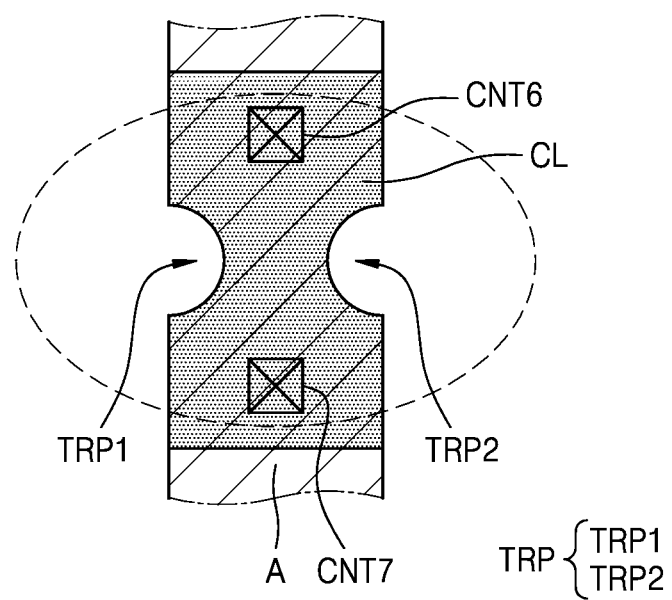
Figure 7:
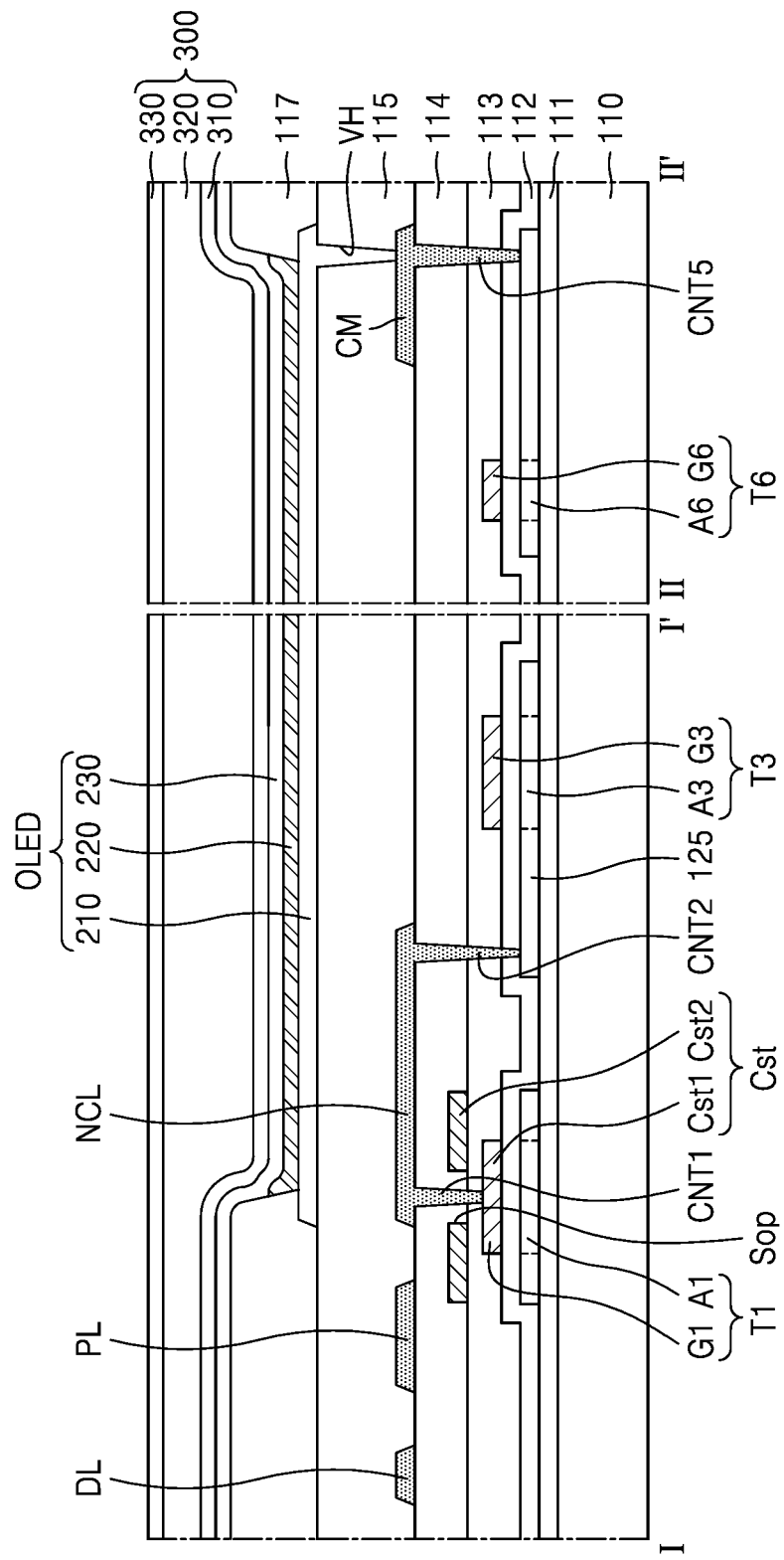
FIG. 7 is a cross-sectional view of an organic light-emitting element taken along line I-I' and II-II' of FIG. 4.

FIG. 4 is an arrangement view of two adjacent pixel circuits applicable to an embodiment. FIG. 5 is an extracted arrangement view of a semiconductor layer and a portion of a signal line among elements in FIG. 4. FIGS. 6A to 6C are enlarged views of a structure applicable to some regions in FIG. 4. FIG. 7 is a cross-sectional view of an organic light-emitting element taken along line I-I' and II-II' of FIG. 4.

As shown in FIGS. 4 and 5, the display apparatus in an embodiment may include the first scan line SL1, the second scan line SL2, a horizontal driving voltage line HPL, the emission control line EL, and the initialization voltage line VIL each extending in the x direction, and the data line DL and the driving voltage line PL each extending in the y direction crossing the x direction.

The first scan line SL1, the second scan line SL2, and the emission control line EL may include the same material and be disposed in the same layer. In an embodiment, the first scan line SL1, the second scan line SL2, and the emission control line EL may be disposed on a first gate insulating layer 112 (refer to FIG. 7), may include a conductive material including aluminum (Al), copper (Cu), titanium (Ti), molybdenum (Mo), or the like, and include a single layer or a multi-layer including the above materials.

The horizontal driving voltage line HPL and the initialization voltage line VIL may be disposed in a layer different from the first scan line SL1. In an embodiment, the horizontal driving voltage line HPL and the initialization voltage line VIL may be disposed on a second gate insulating layer 113 (refer to FIG. 7). The horizontal driving voltage line HPL and the initialization voltage line VIL may include a conductive material including aluminum (Al), copper (Cu), titanium (Ti), and molybdenum (Mo) and include a single layer or a multi-layer including the above materials.

The data line DL and the driving voltage line PL may be disposed in a layer different from the horizontal driving voltage line HPL. In an embodiment, the data line DL and the driving voltage line PL may be disposed on an inter-insulating layer 114 (refer to FIG. 7). The data line DL and the driving voltage line PL may include a conductive material including aluminum (Al), copper (Cu), titanium (Ti), and molybdenum (Mo) and include a single layer or a multi-layer including the above materials.

The driving voltage line PL may be connected to the horizontal driving voltage line HPL disposed in a different layer through a contact hole CNT3. Accordingly, the driving voltage line PL and the horizontal driving voltage line HPL may form a mesh structure.

In addition, the display apparatus may include a first pixel circuit PC1 and a second pixel circuit PC2. The first pixel circuit PC1 may have the same structure as a structure of the second pixel circuit PC2. Unlike this, the first pixel circuit PC1 may be symmetrical to the second pixel circuit PC2 with respect to an imaginary line. The first pixel circuit PC1 and the second pixel circuit PC2 may share the first scan line SL1, the second scan line SL2, the horizontal driving voltage line HPL, the emission control line EL, and the initialization voltage line VIL. Hereinafter, for convenience of description, though some of conductive patterns are described based on the first pixel circuit PC1, these conductive patterns may be equally arranged in the second pixel circuit PC2.

In addition, the display apparatus in an embodiment may include the driving transistor T1, the data-write transistor T2, the compensation transistor T3, the first initialization transistor T4, the operation control transistor T5, the emission control transistor T6, the second initialization transistor T7, and the capacitor Cst.

A driving semiconductor layer A1 of the driving transistor T1, a switching semiconductor layer A2 of the data-write transistor T2, a compensation semiconductor layer A3 of the compensation transistor T3, a first initialization semiconductor layer A4 of the first initialization transistor T4, an operation control semiconductor layer A5 of the operation control transistor T5, an emission control semiconductor layer A6 of the emission control transistor T6, and a second initialization semiconductor layer A7 of the second initialization transistor T7 are disposed in the same layer and include the same material. The semiconductor layers A1, A2, A3, A4, A5, A6, and A7 may be connected to each other and bent in various shapes.

The semiconductor layers A1, A2, A3, A4, A5, A6, and A7 may include polycrystalline silicon or amorphous silicon. In an alternative embodiment, the semiconductor layers A1, A2, A3, A4, A5, A6, and A7 may include an oxide semiconductor material including an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layers A1, A2, A3, A4, A5, A6, and A7 may include a channel region, and a source region and a drain region. The source region and the drain region are on two opposite sides of the channel region. In an embodiment, the source region and the drain region may be doped with impurities. The impurities may include N-type impurities or P-type impurities.

The driving transistor T1 may include the driving semiconductor layer A1 and a driving gate electrode G1. The driving gate electrode G1 may overlap the driving semiconductor layer A1. In addition, the capacitor Cst may be formed over and overlap the driving transistor T1.

The driving semiconductor layer A1 may include a driving channel region, and a driving source region and a driving drain region. The driving source region and the driving drain region are on two opposite sides of the driving channel region. The driving semiconductor layer A1 may have a bent shape, and thus, be formed longer than the other semiconductor layers A2, A3, A4, A5, A6, and A7. In an embodiment, the driving semiconductor layer A1 may have a long channel length in a narrow space by having a shape bent plurality of times, such as an omega or an alphabet S. Because the driving semiconductor layer A1 is formed long, a driving range of a gate voltage applied to the driving gate electrode G1 widens, the grayscale of light emitted from the organic light-emitting element (e.g., organic light-emitting diode) OLED may be more deliberately controlled, and a display quality may be improved.

The capacitor Cst includes a lower electrode Cst1 and an upper electrode Cst2 with a second gate insulating layer 113 therebetween. Here, the driving gate electrode G1 may serve as the lower electrode Cst1, simultaneously. That is, the driving gate electrode G1 may be unitary with the lower electrode Cst1. The second gate insulating layer 113 serves as a dielectric of the capacitor Cst, and a capacitance is determined by charge accumulated in the capacitor Cst and a voltage between two electrodes Cst1 and Cst2.

The lower electrode Cst1 includes an island-shaped floating electrode, includes the same material as a material of the emission control line EL, a switching gate electrode G2, a compensation gate electrode G3, a first initialization gate electrode G4, an operation control gate electrode G5, an emission control gate electrode G6, and a second initialization gate electrode G7, and be formed in the same layer as a layer of these electrodes.

The upper electrode Cst2 is disposed on the second gate insulating layer 113. The upper electrode Cst2 is disposed to overlap an entirety of the lower electrode Cst1, and a storage opening Sop is defined in the upper electrode Cst2. The storage opening Sop may be provided to overlap the lower electrode Cst1. The storage opening Sop may have a single closed curve shape passing through the upper electrode Cst2. Here, the single closed curve means a closed figure with the same starting point and the same ending point when a point is drawn on a straight line or curve, such as a polygon or a circle. The upper electrode Cst2 may be connected to the driving voltage line PL through a contact hole and may receive a driving voltage.

The data-write transistor T2 includes the switching semiconductor layer A2 and the switching gate electrode G2. The switching semiconductor layer A2 include a switching source region and a switching drain region on two opposite sides of a switching channel region. The switching drain region is connected to the driving source region of the driving transistor T1.

The compensation transistor T3 includes the compensation semiconductor layer A3 and the compensation gate electrode G3. The compensation semiconductor layer A3 includes a compensation source region and a compensation drain region on two opposite sides of a compensation channel region. The compensation transistor T3 formed in the compensation semiconductor layer A3 is dual thin-film transistors and includes two compensation channel regions. A region between the compensation channel regions is an impurity-doped region and locally corresponds to a source region of one of the dual thin-film transistors and a drain region of the other. The compensation drain region may be connected to the lower electrode Cst1 through a node connection line NCL. The compensation gate electrode G3 may form a separate dual gate electrode and prevent a leakage current.

The switching gate electrode G2 of the data-write transistor T2 and the compensation gate electrode G3 of the compensation transistor T3 may be provided as portions of the first scan line SL1.

The first initialization transistor T4 includes the first initialization semiconductor layer A4 and the first initialization gate electrode G4. The first initialization semiconductor layer A4 includes a first initialization source region and a first initialization drain region on two opposite sides of a first initialization channel region. The first initialization transistor T4 formed in the first initialization semiconductor layer A4 is dual thin-film transistors and includes two first initialization channel regions. A region between the first initialization channel regions is an impurity-doped region and locally corresponds to a source region of one of the dual thin-film transistors and a drain region of the other. The first initialization drain region may be connected to the lower electrode Cst1 through a node connection line NCL. The first initialization source region may be connected to the initialization voltage line VIL through a connection electrode CM'. The first initialization gate electrode G4 may be provided as a portion of the second scan line SL2.

The operation control transistor T5 includes the operation control semiconductor layer A5 and the operation control gate electrode G5. The operation control semiconductor layer A5 includes an operation control source region and an operation control drain region on two opposite sides of an operation control channel region. The operation control drain region may be connected to the driving source region.

The emission control transistor T6 includes an emission control semiconductor layer A6 and the emission control gate electrode G6. The emission control semiconductor layer A6 includes an emission control source region and an emission control drain region on two opposite sides of an emission control channel region. The emission control source region may be connected to the driving drain region.

The operation control gate electrode G5 and the emission control gate electrode G6 may be provided as portions of the emission control line EL.

The second initialization transistor T7 includes the second initialization semiconductor layer A7 and the second initialization gate electrode G7. The second initialization semiconductor layer A7 includes a second initialization source region and a second initialization drain region on two opposite sides of a second initialization channel region. The second initialization gate electrode G7 may be provided as a portion of the second scan line SL2.

One end of the driving semiconductor layer A1 of the driving transistor T1 is connected to the switching semiconductor layer A2 and the operation control semiconductor layer A5, and another end of the driving semiconductor layer A1 is connected to the compensation semiconductor layer A3 and the emission control semiconductor layer A6.

The lower electrode Cst1 of the capacitor Cst is connected to the compensation transistor T3 and the first initialization transistor T4 together through the node connection line NCL. The node connection line NCL is formed in the same layer as the first scan line SL1. One end of the node connection line NCL is connected to the lower electrode Cst1 through a first node contact hole CNT1 defined in the second gate insulating layer 113 and the inter-insulating layer 114. Here, the first node contact hole CNT1 is provided to be disposed inside the storage opening Sop of the upper electrode Cst2. Because the size of the storage opening Sop is defined greater than the size of the first node contact hole CNT1, the first node contact hole CNT1 may be connected to the lower electrode Cst1 without contacting the upper electrode Cst2.

The node connection line NCL is connected to a region between the compensation semiconductor layer A3 and the first initialization semiconductor layer A4 through a second node contact hole CNT2 defined in the first gate insulating layer 112, the second gate insulating layer 113, and the inter-insulating layer 114.

The upper electrode Cst2 of the capacitor Cst is connected to the driving voltage line PL through a contact hole in the inter-insulating layer 114 and receives the driving voltage ELVDD from the driving voltage line PL. The upper electrode Cst2 of the capacitor Cst may be provided as a portion of the horizontal driving voltage line HPL.

The data-write transistor T2 is used as a switching element which selects a pixel to emit light. The switching gate electrode G2 is provided as a portion of the first scan line SL1, the switching source region of the switching semiconductor layer A2 is connected to a data line DL through a contact hole CNT4, and the switching drain region is connected to the driving semiconductor layer A1 and the operation control semiconductor layer A5.

In addition, the emission control drain region of the second emission control semiconductor layer A6 of the second emission control transistor T6 is connected to a connection electrode CM through a contact hole CNT5 defined in the inter-insulating layer 114, and the connection electrode CM may be directly connected to the pixel electrode of the organic light-emitting element OLED through a via hole VH defined in a via layer 115.

The display apparatus in an embodiment may include a structure capable of darkening instead of brightly lighting when an external impact is applied. Referring to FIG. 5, which is an arrangement view of the semiconductor layers A1, A2, A3, A4, A5, A6, and A7, and the gate electrodes G1, G2, G3, G4, G5, G6, and G7, at least one trench TRP may be defined in a wiring (e.g., a semiconductor layer) arranged in the first region B1, the second region B2, and the third region B3. The trench TRP may be a recess indented in a width direction from the edge of the wiring or the semiconductor layer.

The first region B1 may be a region including a wiring between the emission control gate electrode G6 of the emission control transistor T6 and the contact hole CNT5 connected to the pixel electrode in a plan view. The first region B1 may be a region including a portion of the drain region of the emission control semiconductor layer A6 of the emission control transistor T6.

The second region B2 may be a region including a wiring between the emission control gate electrode G6 of the emission control transistor T6 and the driving gate electrode G1 of the driving transistor T1 in a plan view. The second region B2 may be a region including a portion of the source region of the emission control semiconductor layer A6 of the emission control transistor T6.

The third region B3 may be a region including a wiring connecting the compensation transistor T3 to the first initialization transistor T4 in a plan view. The third region B3 may be a region including a portion of the compensation semiconductor layer A3 and/or a portion of the first initialization semiconductor layer A4.

FIGS. 6A to 6C are schematic views of a planar shape of a region corresponding to at least one of the first to third regions B1, B2, and B3.

Referring to FIG. 6A, a wiring arranged in the first to third regions B1, B2, and B3 may be provided as a semiconductor layer A, and the trench TRP indented in the width direction of the wiring may be defined in a portion of the semiconductor layer A. Accordingly, a first width Wt1 of the wiring corresponding to the trench TRP may be less than a second width Wt2 of the wiring that does not include the trench TRP. In an embodiment, the first width Wt1 may be about 0.3 times or 0.7 times the second width Wt2. Though it is shown in FIG. 6A, the trench TRP is provided in one edge of the wiring, the disclosure is not limited thereto.

As shown in FIG. 6B, the trench TRP may be provided in two opposite edges of the wiring. That is, the trench TRP may include a first trench TRP1 and a second trench TRP2. The first trench is arranged in the left of the wiring, and the second trench TRP2 is arranged in the right of the wiring. As shown in FIG. 6B, the first trench TRP1 may face the second trench TRP2. Unlike this, the first trench TRP1 and the second trench TRP2 may be alternately arranged without facing each other.

Referring to FIG. 6C, the trench TRP may be defined in a connection wiring CL connecting the semiconductor layers A apart from each other. The connection wiring CL may be disposed in a different layer from the semiconductor layers A. In an embodiment, the connection wiring CL may be disposed on the inter-insulating layer 114 and connected to the semiconductor layers A apart from each other through contact holes CNT6 and CNT7.

As described above, because at least one trench TRP is defined in the wirings (e.g., the semiconductor layers) arranged in the first to third regions B1, B2, and B3, in the case where external impacts are applied, at least one of the wirings arranged in the first to third regions B1, B2, and B3 may be disconnected. Accordingly, a pixel connected to the pixel circuit may be darkened.

Hereinafter, constructions included in the display apparatus according to an embodiment are described according to a stack sequence with reference to FIG. 7. FIG. 7 is a cross-sectional view of an organic light-emitting element taken along line I-I' and II-II' of FIG. 4.

The substrate 110 may include a glass material, a ceramic material, metal, or a flexible or bendable material. In the case where the substrate 110 is flexible or bendable, the substrate 110 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 110 may have a single-layered structure or a multi-layered structure of the above materials, and may further include an inorganic layer in the case of the multi-layered structure. In an embodiment, the substrate 110 may have a structure of an organic material/an inorganic material/an organic material.

A buffer layer 111 may be arranged on the substrate 110, may reduce or block penetration of foreign materials, moisture, or external air from below the substrate 110, and provide a flat surface on the substrate 110. The buffer layer 111 may have a single-layered structure or a multi-layered structure including an inorganic material such as an oxide or a nitride.

A barrier layer (not shown) may be further disposed between the substrate 110 and the buffer layer 111. The barrier layer may prevent or reduce the penetration of impurities from the substrate 100 or the like to the semiconductor layers A1, A2, A3, A4, A5, A6, and A7. The barrier layer may include an inorganic material, an organic material, or an organic/inorganic composite material, and include a single layer or a multi-layer including an inorganic material and an organic material, the inorganic material including oxide or nitride.

The semiconductor layers A1, A3, and A6 may be disposed on the buffer layer 111. The semiconductor layers A1, A3, and A6 may include amorphous silicon or polycrystalline silicon. In another embodiment, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layers A1, A3, and A6 may include Zn-oxide-based material and include Zn-oxide, In—Zn oxide, and Ga—In—Zn oxide. In another embodiment, the semiconductor layers A1, A3, and A6 may include In—Ga—Zn—O ("IGZO"), In—Sn—Zn—O ("ITZO"), or In—Ga—Sn—Zn—O ("IG-TZO") semiconductor including metal such as indium (In), gallium (Ga), and stannum (Sn) in ZnO. The semiconductor layers A1, A3, and A6 may include a channel region, a drain region, and a source region, the drain region and the source region being on two opposite sides of the channel region. The semiconductor layers A1, A3, A6 may include a single layer or a multi-layer.

The gate electrodes G1, G3, and G6 are disposed over the semiconductor layers A1, A3, and A6 with the first gate insulating layer 112 therebetween to at least partially overlap the semiconductor layers A1, A3, and A6. The gate electrodes G1, G3, and G6 may include at least one of molybdenum (Mo), aluminum (Al), copper (Cu), titanium (Ti) or the like and include a single layer or a multi-layer. In an embodiment, the gate electrodes G1, G3, and G6 may include a single Mo layer.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), or hafnium oxide ($HfO_2$).

The second gate insulating layer 113 may be provided to cover the gate electrodes G1, G3, and G6. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), or hafnium oxide ($HfO_2$).

The lower electrode Cst1 of the capacitor Cst may overlap the driving transistor T1. In an embodiment, the driving gate electrode G1 of the driving transistor T1 may serve as the lower electrode Cst1 of the capacitor Cst.

The upper electrode Cst2 of the capacitor Cst may overlap the lower electrode Cst1 with the second gate insulating layer 113 therebetween. In this case, the second gate insulating layer 113 may serve as a dielectric layer of the capacitor Cst. The upper electrode Cst2 may include a conductive material including molybdenum (Mo), aluminum (Al), copper (Cu), or titanium (Ti) and have a single-layered structure or a multi-layered structure including the above materials.

The inter-insulating layer 114 may be provided to cover the upper electrode Cst2 of the capacitor Cst. The inter-insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), or hafnium oxide ($HfO_2$).

The data line DL, the driving voltage line PL, the node connection line NCL, and the connection electrode CM are disposed on the inter-insulating layer 114. The data line DL, the driving voltage line PL, the node connection line NCL, and the connection electrode CM may include a conductive material including aluminum (Al), copper (Cu), or titanium (Ti) and have a single-layered structure or a multi-layered structure including the above materials. In an embodiment, the data line DL, the driving voltage line PL, the node connection line NCL, and the connection electrode CM may have a multi-layered structure of Ti/Al/Ti.

One end of the node connection line NCL may be connected to the driving gate electrode G1 through a first node contact hole CNT1 passing through the inter-insulating layer 114 and the second gate insulating layer 113, and another end of the node connection line NCL may be connected to a semiconductor connection line 125 through a second node contact hole CNT2 passing through the inter-insulating layer 114, the second gate insulating layer 113, and the first gate insulating layer 112. The semiconductor connection line 125 may be a wiring extending from the compensation drain region of the compensation transistor T3.

The connection electrode CM may be connected to the emission control drain region of the emission control transistor T6 through a contact hole CNT5 passing through the inter-insulating layer 114, the second gate insulating layer 113, and the first gate insulating layer 112.

A via layer 115 may be disposed on the data line DL, the driving voltage line PL, the node connection line NCL, and the connection electrode CM. The organic light-emitting element OLED may be disposed on the via layer 115.

The via layer 115 may include a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and any combinations thereof.

The organic light-emitting element OLED may be disposed on the via layer 115. The organic light-emitting element OLED includes a pixel electrode 210, an opposite electrode 230, and an intermediate layer 220 therebetween, and the intermediate layer 220 may include an emission layer.

The pixel electrode 210 may be connected to the connection electrode CM through a via hole VH passing through the via layer 115. The connection electrode CM may be connected to the emission control drain region of the emission control transistor T6 through a contact hole CNT5. Accordingly, the pixel electrode 210 may be electrically connected to the emission control drain region of the emission control transistor T6.

A pixel-defining layer 117 may be disposed on the via layer 115. The pixel-defining layer 117 defines a pixel by defining an opening corresponding to each sub-pixel, that is, an opening exposing at least a central portion of the pixel electrode 210. In addition, the pixel-defining layer 117 prevents arcs or the like from occurring at the edges of each pixel electrode 210 by increasing a distance between the edges of each pixel electrode 210 and the opposite electrode 230 over the pixel electrode 210. The pixel-defining layer 117 may include an organic material such as polyimide or HMDSO.

The intermediate layer 220 of the organic light-emitting element OLED may include a low-molecular weight material or a polymer material. In the case where the intermediate layer 220 includes a low molecular weight material, the intermediate layer 220 may have a structure in which a hole injection layer ("HIL"), a hole transport layer ("HTL"), an emission layer ("EML"), an electron transport layer ("ETL"), an electron injection layer ("EIL"), etc., are stacked in a single or composite configuration. The intermediate layer 220 may include various organic materials such as copper phthalocyanine (CuPc), N,N'-Di (naphthalene-1-yl)-N,N'-diphenyl-benzidine (NPB), or tris-8-hydroxyquinoline aluminum (Alq3). These layers may be formed by vacuum deposition.

In the case where the intermediate layer 220 includes a polymer material, the intermediate layer 220 may have a structure including an HTL and an EML. In this case, the HTL may include poly (3,4-ethylenedioxythiophene) ("PEDOT"), and the EML may include a polymer material such as a polyphenylene vinylene ("PPV")-based material and a polyfluorene-based material. The intermediate layer 220 may be formed by screen printing, inkjet printing, laser induced thermal imaging ("LITI"), or the like.

The intermediate layer 220 is not necessarily limited thereto but may have various structures. The intermediate layer 220 may include a layer, which is one body over the plurality of pixel electrodes 210, or include a layer patterned to correspond to each of the plurality of pixel electrodes 210.

The opposite electrode 230 may be formed as one body over the plurality of organic light-emitting elements to correspond to the plurality of pixel electrodes 210. The opposite electrode 230 may be a light-transmissive electrode or a reflective electrode. In an embodiment, the opposite electrode 230 may be a transparent or semi-transparent electrode and may include a metal thin film including Li, Ca, LiF/Ca, LiF/Al, Al, Ag, Mg, or combination thereof and having a small work function. In addition, a transparent conductive oxide ("TCO") layer such as ITO, IZO, ZnO, or $In_2O_3$ may be further arranged on the metal thin film.

Because the organic light-emitting element OLED may be easily damaged by external moisture, oxygen, or the like, a thin-film encapsulation layer 300 may protect the organic light-emitting element OLED by covering the organic light-emitting element OLED. The thin-film encapsulation layer 300 may cover the display area DA and extend to the outside of the display area DA. In an embodiment, the thin-film encapsulation layer 300 includes a first inorganic encapsulation layer 310, an organic encapsulation layer 320, and a second inorganic encapsulation layer 330.

The first inorganic encapsulation layer 310 may cover the opposite electrode 230 and include ceramic, metal oxide, metal nitride, metal carbide, metal oxynitride, indium oxide ($In_2O_3$), tin oxide ($SnO_2$), and indium tin oxide ("ITO"), silicon oxide, silicon nitride and/or silicon oxynitride or the like. When desired, other layers including a capping layer may be disposed between the first inorganic encapsulation layer 310 and the opposite electrode 230. Because the first inorganic encapsulation layer 310 is formed along a structure thereunder, the upper surface of the first inorganic encapsulation layer 310 is not flat.

The organic encapsulation layer 320 may cover the first inorganic encapsulation layer 310 and, unlike the first inorganic encapsulation layer 310, the upper surface of the organic encapsulation layer 320 may be approximately flat. Specifically, the upper surface of a portion of the organic encapsulation layer 320 that corresponds to the display area DA may be approximately flat. The organic encapsulation layer 320 may include at least one material among acryl, methacryl, polyester, polyethylene, polypropylene, polyethylene terephthalate, polyethylene naphthalate, polycarbonate, polyimide, polyethylene sulfonate, polyoxym ethylene, polyarylate, and hexamethyldisiloxane.

The second inorganic encapsulation layer 330 may cover the organic encapsulation layer 320 and include ceramic, metal oxide, metal nitride, metal carbide, metal oxynitride, indium oxide ($In_2O_3$), tin oxide ($SnO_2$), and indium tin oxide ("ITO"), silicon oxide, silicon nitride and/or silicon oxynitride or the like.

Because the thin-film encapsulation layer 300 includes the first inorganic encapsulation layer 310, the organic encapsulation layer 320, and the second inorganic encapsulation layer 330, even when cracks occur inside the thin-film encapsulation layer 300, the cracks may not be connected between the first inorganic encapsulation layer 310 and the organic encapsulation layer 320 or between the organic encapsulation layer 320 and the second inorganic encapsulation layer 330 through the above multi-layered structure. With this configuration, forming of a path through which external moisture or oxygen penetrates the display area DA may be prevented or reduced.

Though not shown, a spacer which prevents mask chopping may be further disposed on the pixel-defining layer 117. Various functional layers such as a polarizing layer, a black matrix, color filters, and/or a touch screen layer may be disposed on the thin-film encapsulation layer 300. The polarizing layer reduces external light reflection, and the touch screen layer including touch electrodes.

Figure 8:
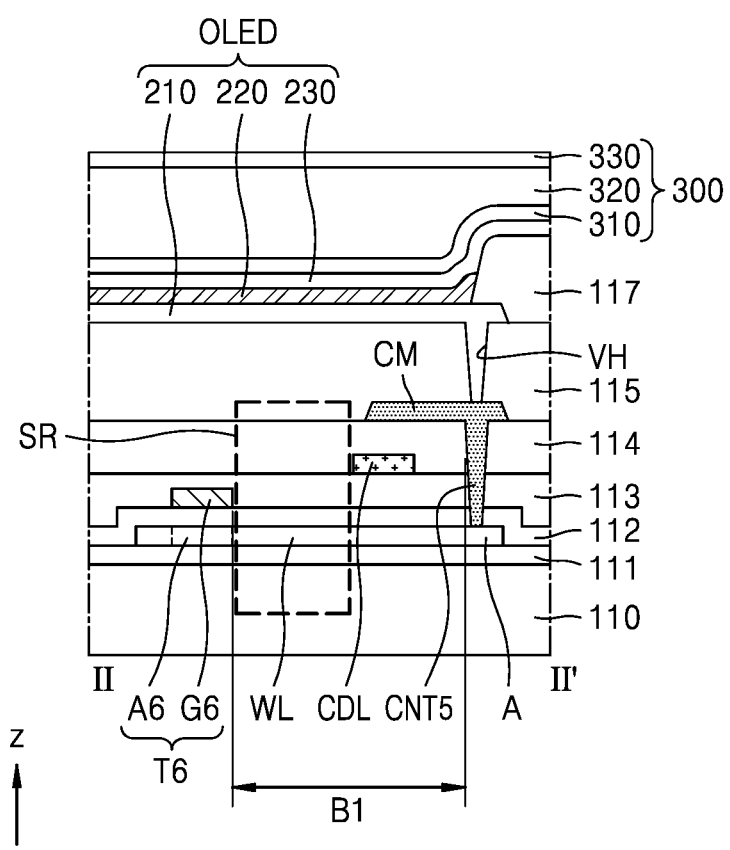
FIG. 8 is a schematic cross-sectional view of an embodiment of a portion of a display apparatus.

FIG. 8 is a schematic cross-sectional view of an embodiment of a portion of a display apparatus. Specifically, FIG. 8 is a cross-sectional view of the first region B1. In FIG. 8, the same reference numerals as those of FIG. 7 denote the same members, and thus, repeated descriptions thereof are omitted.

Referring to FIG. 8, a conductive layer CDL may be arranged in the first region B1. In a plan view, the first region B1 may be a region between the emission control gate electrode G6 of the emission control transistor T6 and the contact hole CNT5 through which the connection electrode CM is connected to the emission control semiconductor layer A6. The conductive layer CDL may be arranged in the edge of the first region B1. The conductive layer CDL may be apart by a preset distance from the emission control gate electrode G6 in a plan view. The conductive layer CDL may overlap at least a portion of the connection electrode CM in the thickness direction of the substrate 110. The conductive layer CDL may be disposed not to overlap the emission control gate electrode G6 in the thickness direction (a z direction) of the substrate 110.

Because the conductive layer CDL is arranged in the edge of the first region B1 and thus disposed to face the emission control gate electrode G6 with a preset distance therebetween, a high strain may be induced in a region SR between the emission control gate electrode G6 and the conductive layer CDL. This means that high strain may be applied to a wiring WL arranged in the first region B1 and provided as a portion of the semiconductor layer A. Accordingly, in the case where external impacts are applied, disconnection of the wiring WL may be easily induced. In the case where the wiring WL is disconnected, because the driving current is not applied to the organic light-emitting element OLED, the organic light-emitting element OLED may be darkened without emitting light.

The conductive layer CDL may be disposed in a layer different from the gate electrode G6 and the connection electrode CM. In an embodiment, the conductive layer CDL may be disposed on the second gate insulating layer 113. The conductive layer CDL may include a conductive material including molybdenum (Mo), aluminum (Al), copper (Cu), or titanium (Ti) and have a single-layered structure or a multi-layered structure including the above materials. The conductive layer CDL may include a material similar to a material of the emission control gate electrode G6. In an embodiment, the conductive layer CDL may be an isolated pattern without being connected to other conductive members.

Though it is shown in FIG. 8 that the conductive layer CDL is arranged in the first region B1, the conductive layer CDL may be arranged in the second region B2 and/or the third region B3.

Figure 9:
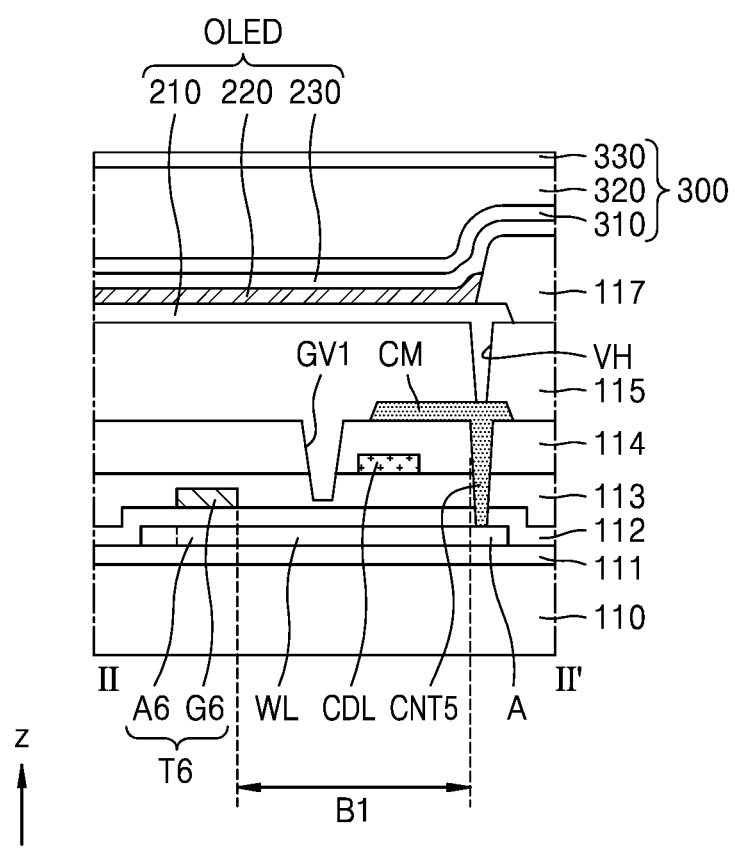
FIG. 9 is a schematic cross-sectional view of an embodiment of a portion of a display apparatus.

FIG. 9 is a schematic cross-sectional view of an embodiment of a portion of the display apparatus. Specifically, FIG. 9 is a cross-sectional view of the first region B1. In FIG. 9, the same reference numerals as those of FIGS. 7 and 8 denote the same members, and thus, repeated descriptions thereof are omitted.

FIG. 9 is a schematic cross-sectional view of an embodiment of a portion of the display apparatus. Assuming that the buffer layer 111, the first gate insulating layer 112, the second gate insulating layer 113, and the inter-insulating layer 114 are collectively referred to as an inorganic insulating layer IL, a first groove GV1 corresponding to the first region B1 may be defined in the inorganic insulating layer IL. The first groove GV1 may have a shape defined by removing a portion of the inorganic insulating layer IL in the thickness direction.

As shown in the drawing, the first groove GV1 may include an opening of the inter-insulating layer 114 and a groove of the second gate insulating layer 113 overlapping each other. Unlike this, the first groove GV1 may include an opening of the inter-insulating layer 114 and an opening of the second gate insulating layer 113 overlapping each other. The via layer 115 including an organic material may fill the first groove GV1.

The first groove GV1 may be provided in a single closed curve such as a rectangle, a circle, or the like in a plan view, or provided in a continuous line shape crossing the pixel circuit in a plan. However, various changes may be made.

The first groove GV1 may be arranged in the first region B1 inside the pixel circuit and may overlap the semiconductor layer A. The first groove GV1 may overlap the wiring WL including the semiconductor layer A. Because the first groove GV1 is defined, a strain applied to the first region B1 may be concentrated on the semiconductor layer A. Accordingly, when external impacts are applied, disconnection of the wiring WL may be easily induced.

The first groove GV1 may be disposed between the emission control gate electrode G6 and the conductive layer CDL. The conductive layer CDL may be arranged on the edge of the first region B1 and may induce a higher strain in the wiring WL overlapping the first groove GV1. In an embodiment, the conductive layer CDL may be omitted.

Though it is shown in FIG. 9 that the first groove GV1 is arranged in the first region B1, the first groove GV1 may be arranged in the second region B2 and/or the third region B3.

Figure 10:
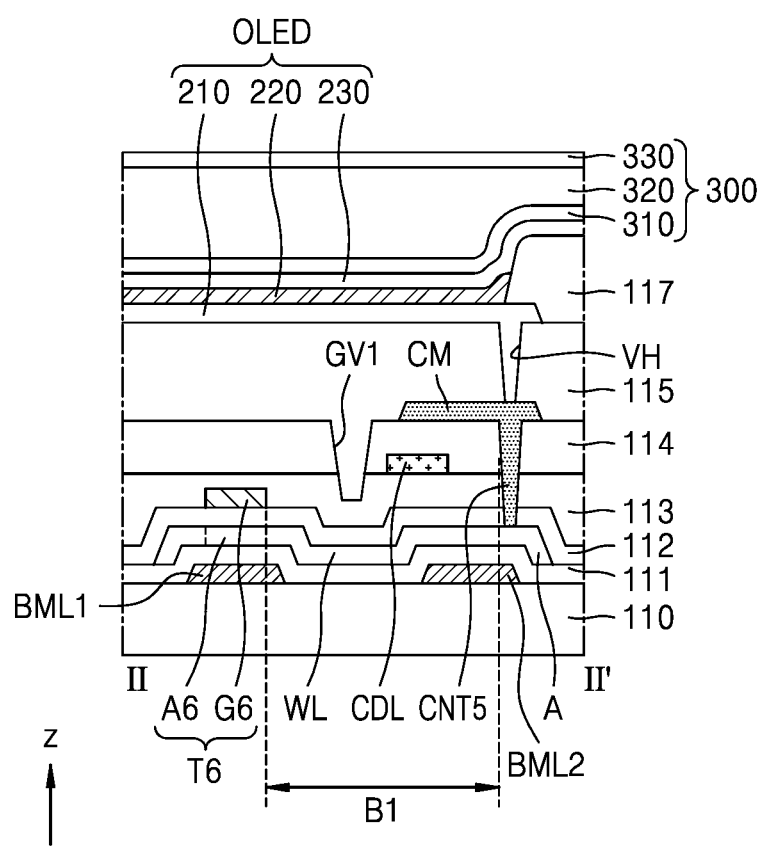
FIG. 10 is a schematic cross-sectional view of an embodiment of a portion of a display apparatus.

FIG. 10 is a schematic cross-sectional view of an embodiment of a portion of the display apparatus. Specifically, FIG. 10 is a cross-sectional view of the first region B1. In FIG. 10, the same reference numerals as those of FIGS. 7 to 9 denote the same members, and thus, repeated descriptions thereof are omitted.

Referring to FIG. 10, a first lower metal layer BML1 and a second lower metal layer BML2 may be disposed between the substrate 110 and the buffer layer 111. The first lower metal layer BML1 may be apart from the second lower metal layer BML2 with at least a portion of the first region B1 therebetween. The first lower metal layer BML1 may at least partially overlap the emission control gate electrode G6. The second lower metal layer BML2 may at least partially overlap the connection electrode CM.

Because the first lower metal layer BML1 and the second lower metal layer BML2 are provided, the buffer layer 111 and the semiconductor layer A disposed thereon may be formed to be bent along the shapes of the first lower metal layer BML1 and the second lower metal layer BML2. That is, the semiconductor layer A disposed on the intermediate regions of the first lower metal layer BML1 and the second lower metal layer BML2 may be formed to be indented in the direction of the substrate 110. Accordingly, a structure to which a high strain may be applied may be formed on the semiconductor layer A.

The first lower metal layer BML1 and the second lower metal layer BML2 may each include a conductive material including molybdenum (Mo), aluminum (Al), copper (Cu), or titanium (Ti) and have a single-layered structure or a multi-layered structure including the above materials.

The first groove GV1 may be disposed between the first lower metal layer BML1 and the second lower metal layer BML2 in a plan view. The conductive layer CDL may at least partially overlap the second lower metal layer BML2. In an embodiment, the first groove GV1 and/or the conductive layer CDL may be omitted.

Figure 11:
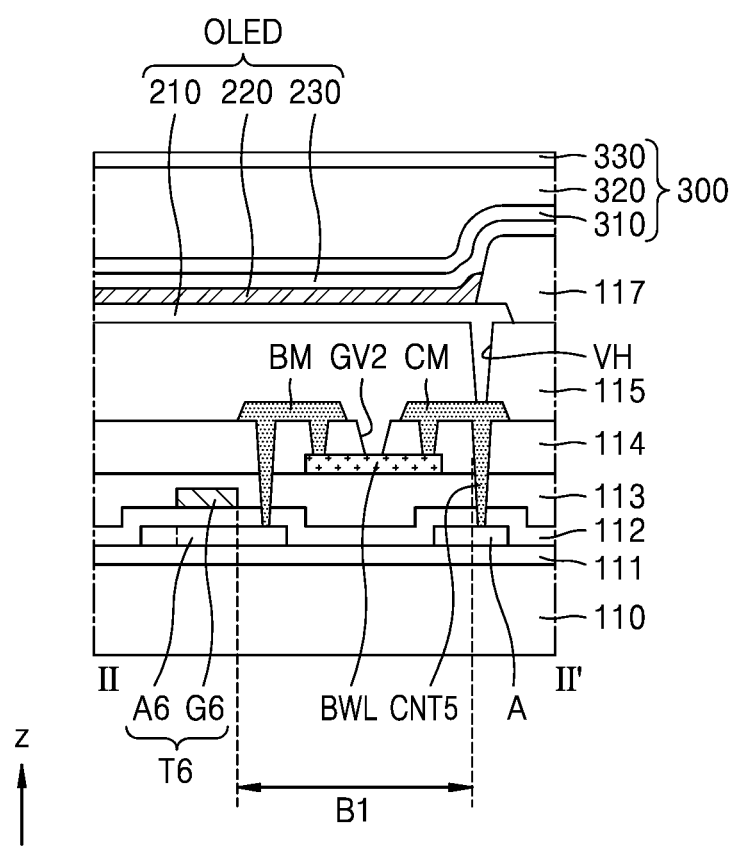
FIG. 11 is a schematic cross-sectional view of an embodiment of a portion of a display apparatus.

FIG. 11 is a schematic cross-sectional view of a portion of the display apparatus. Specifically, FIG. 11 is a cross-sectional view of the first region B1. In FIG. 11, the same reference numerals as those of FIG. 7 denote the same members, and thus, repeated descriptions thereof are omitted.

Referring to FIG. 11, the emission control transistor T6 may be connected to the pixel electrode 210 through a bridge wiring BWL. In this case, a second groove GV2 may be provided in an inorganic insulating layer disposed on the bridge wiring BWL. The second groove GV2 overlaps the bridge wiring BWL.

The bridge wiring BWL may be disposed on the second gate insulating layer 113. The bridge wiring BWL may be connected to the semiconductor layer A6 of the emission control transistor T6 through a bridge electrode BM. The bridge wiring BWL may be connected to the pixel electrode 210 through the connection electrode CM.

The bridge electrode BM may be formed in the same layer as the connection electrode CM and may include the same material as a material of the connection electrode CM. The bridge electrode BM and the connection electrode CM may be disposed on the inter-insulating layer 114. The bridge electrode BM may be connected to the bridge wiring BWL and the emission control semiconductor layer A6 through contact holes, respectively. The connection electrode CM may be connected to the bridge wiring BWL and the semiconductor layer A through contact holes, respectively. The pixel electrode 210 may be connected to the connection electrode CM through the via hole VH.

The bridge wiring BWL may include a conductive material including a transparent conductive oxide ("TCO") such as molybdenum (Mo), aluminum (Al), copper (Cu), titanium (Ti), ITO, IZO, ZnO, or $In_2O_3$, and include a single layer or a multi-layer including the above materials.

The second groove GV2 may be provided in a groove or an opening of the inter-insulating layer 114. The second groove GV2 may be provided in a single closed curve such as a rectangle, a circle, or the like in a plan view, or provided in a continuous line shape crossing the pixel circuit in a plan. However, various changes may be made. The via layer 115 including an organic material may fill the second groove GV2.

The second groove GV2 may be arranged in the first region B1 inside the pixel circuit and may overlap the bridge wiring BWL. Because the second groove GV2 is defined, a strain applied to the first region B1 may be concentrated on the bridge wiring BWL. Accordingly, when external impacts are applied, disconnection of the bridge wiring BWL may be easily induced.

Figure 12:
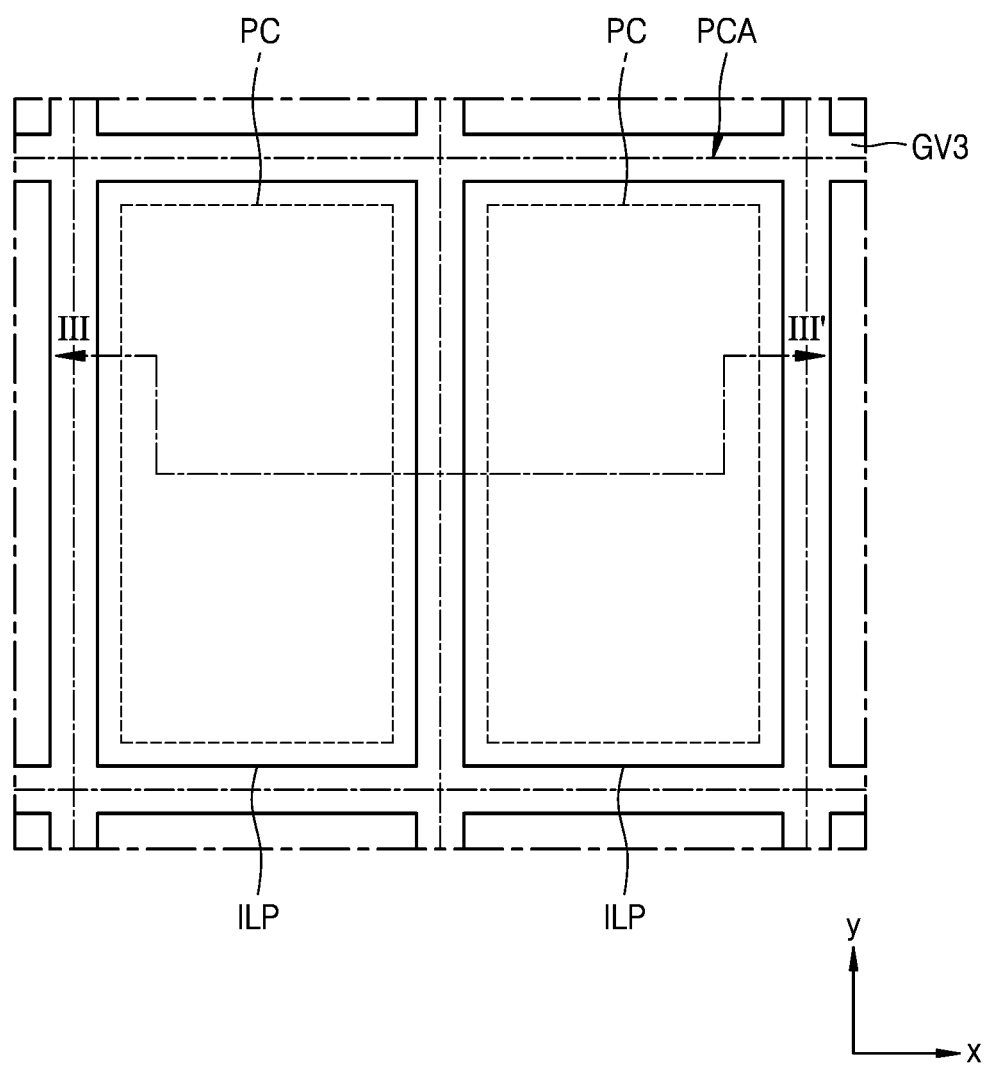
FIG. 12 is a schematic plan view of an embodiment of a pixel area in which pixel circuits are arranged.
Figure 13:
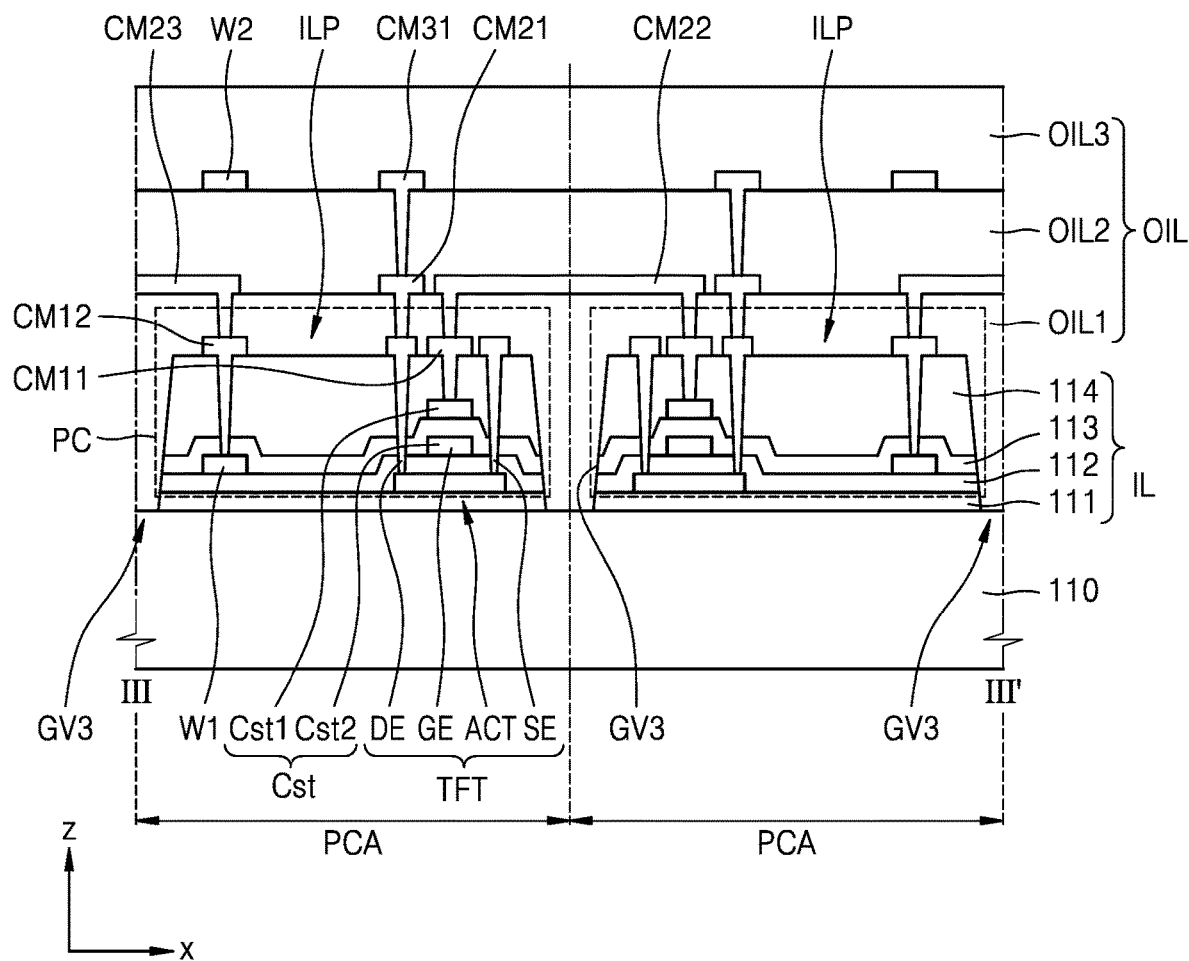
FIG. 13 is a schematic cross-sectional view of a portion of a display apparatus, taken along line III-III' of FIG. 12.

FIG. 12 is a schematic plan view of an embodiment of a pixel area in which pixel circuits are arranged. FIG. 13 is a schematic cross-sectional view of a portion of the display apparatus, taken along line III-III' of FIG. 12. In FIG. 13, the same reference numerals as those of FIG. 7 denote the same members.

Referring to FIG. 12, the display apparatus in which a third groove GV3 is defined may include an inorganic insulating pattern ILP. The third groove GV3 is defined along boundary lines of a pixel area PCA, and the inorganic insulating pattern ILP is surrounded by the third groove GV3. The inorganic insulating pattern ILP may include a plurality of inorganic insulating layers, and elements of the pixel circuit PC may be disposed on the inorganic insulating layers. Accordingly, it is understood that the third groove GV3 surrounds the pixel circuit PC.

The pixel circuit PC may be disposed over the substrate 110. The pixel circuit PC includes a thin-film transistor TFT and the capacitor Cst. The thin-film transistor TFT may include the first to seventh transistors T1, T2, T3, T4, T5, T6, and T7. The thin-film transistor TFT may include a semiconductor layer ACT, a source electrode SE, a drain electrode DE, and a gate electrode GE. The capacitor Cst may include the lower electrode Cst1 and the upper electrode Cst2.

The third groove GV3 may be defined in the inorganic insulating layer IL collectively referring the buffer layer 111, the first gate insulating layer 112, the second gate insulating layer 113, and the inter-insulating layer 114. The third groove GV3 surrounds the pixel area PCA. That is, the inorganic insulating layer IL may have the third groove GV3 or the opening corresponding to the pixel area PCA. The third groove GV3 may have a shape defined by removing a portion of the inorganic insulating layer IL. In an embodiment, the inorganic insulating layer IL may include the inorganic insulating patterns ILP having an island shape in units of the pixel area PCA by the third groove GV3.

The third groove GV3 may be provided between the pixel areas PCA adjacent to each other and may surround the pixel area PCA. An opening of the buffer layer 111, an opening of the first gate insulating layer 112, an opening of the second gate insulating layer 113, and an opening of the inter-insulating layer 114 may overlap each other. The opening of the buffer layer 111, the opening of the first gate insulating layer 112, the opening of the second gate insulating layer 113, and the opening of the inter-insulating layer 114 may be respectively defined through separate processes, or simultaneously defined through the same process. In the case where the opening of the buffer layer 111, the opening of the first gate insulating layer 112, the opening of the second gate insulating layer 113, and the opening of the inter-insulating layer 114 are respectively defined through separate processes, the third groove GV3 may have a step difference such as a stair shape.

Contact holes may be defined in at least one of the first gate insulating layer 112, the second gate insulating layer 113, and the inter-insulating layer 114. The contact holes for allowing a conductive layer formed subsequent to the inter-insulating layer 114 to contact the lower conductive layer (e.g., the semiconductor layer, the gate electrode, the capacitor upper electrode, the scan line, or the like). Contact holes may be defined simultaneously while the third groove GV3 is defined.

The source electrode SE and the drain electrode DE may be disposed on the inter-insulating layer 114. The source electrode SE and the drain electrode DE may be connected to the source region and the drain region of the semiconductor layer ACT through contact holes, respectively. First connection electrodes CM11 and CM12 may be further disposed on the inter-insulating layer 114. The first connection electrode CM11 may be connected to the upper electrode Cst2 of the capacitor Cst through a contact hole. The first connection electrode CM12 may be connected to a lower signal line W1 through a contact hole. The source electrode SE, the drain electrode DE, the first connection electrodes CM11 and CM12 may include a conductive material including molybdenum (Mo), aluminum (Al), copper (Cu), or titanium (Ti) and include a single layer or a multi-layer including the above materials. In an embodiment, the source electrode SE and the drain electrode DE may have a triple structure of Ti/Al/Ti sequentially stacked.

A first organic insulating layer OIL1 may cover the source electrode SE, the drain electrode DE, and the first connection electrodes CM11 and CM12. The first organic insulating layer OIL1 may fill the third groove GV3. The first organic insulating layer OIL1 may be disposed between the inorganic insulating patterns ILP. Because the first organic insulating layer OIL1 is arranged to surround the pixel area PCA along the third groove GV3, the pixel circuits PC and the signal lines connected to the pixel circuits PC may be separated on a pixel area PCA basis. Accordingly, stress or cracks due to folding of the display panel may be prevented from propagating to other pixel areas.

Second connection electrodes CM21, CM22, and CM23 may be disposed on the first organic insulating layer OIL1. The second connection electrode CM21 may be connected to the source electrode SE or the drain electrode DE through a contact hole of the first organic insulating layer OIL1. The second connection electrode CM22 may be connected to the first connection electrode CM11 through a contact hole of the first organic insulating layer OIL1. Because the second connection electrode CM22 is connected to the first connection electrode CM11 of the pixel circuit PC crossing the third groove GV3 and adjacent in a row direction, the second connection electrode CM22 may connect the upper electrodes Cst2 of the capacitor Cst. In an embodiment, the upper electrode Cst2 of the capacitor Cst of each pixel circuit PC may be connected to the driving voltage line PL. The second connection electrode CM23 may be connected to the first connection electrode CM12 through a contact hole of the first organic insulating layer OIL1. Because the second connection electrode CM23 is connected to the first connection electrode CM12 of the pixel circuit PC crossing the third groove GV3 and adjacent in a row direction, the second connection electrode CM23 may connect lower signal lines W1 separated in units of pixel areas PCA in the same row. The second connection electrode CM21, CM22, and CM23 may include a conductive material including molybdenum (Mo), aluminum (Al), copper (Cu), or titanium (Ti) and have a single-layer or a multi-layer including the above materials.

The second organic insulating layer OIL2 may cover the second connection electrodes CM21, CM22, and CM23. The third connection electrode CM31 and at least one upper signal line W2 may be disposed on the second organic insulating layer OIL2. The third connection electrode CM31 may be connected to the second connection electrode CM21 through a contact hole of the second organic insulating layer OIL2. At least one upper signal line W2 may include the data line DL and the driving voltage line PL. The at least one upper signal line W2 may not be separated for each pixel area PCA. The at least one upper signal line W2 may be connected to the pixel circuit PC crossing the third groove GV3 and adjacent in a column direction. The third connection electrode CM31 and the at least one upper signal line W2 may include a conductive material including molybdenum (Mo), aluminum (Al), copper (Cu), or titanium (Ti) and have a single-layer or a multi-layer including the above materials.

The third organic insulating layer OIL3 may cover the third connection electrode CM31 and the at least one upper signal line W2. The first organic insulating layer OIL1, the second organic insulating layer OIL2, and the third organic insulating layer OIL3 may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

An organic light-emitting element (not shown) may be disposed on the third organic insulating layer OIL3.

Though it is shown in FIG. 12 that the third groove GV3 surrounds one pixel circuit, the disclosure is not limited thereto. The third groove GV3 may be defined to surround a plurality of pixels. However, various changes may be made.

As described above, embodiments may provide the display apparatus with a high reliability against even external impacts by defining the trench or the like in a portion of the wirings included in the pixel circuit.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
   a substrate including a display area;
   a pixel circuit arranged in the display area of the substrate, the pixel circuit including:
      a plurality of wirings;
      a driving transistor;
      a compensation transistor; and,
      a first initialization transistor and an emission control transistor; and
   a light-emitting element connected to the pixel circuit,
   wherein at least one of the plurality of wirings includes a trench indented in a width direction of the at least one of the plurality of wirings.

2. The display apparatus of claim 1, further comprising a connection electrode connecting an emission control semiconductor layer of the emission control transistor to a pixel electrode of the light-emitting element,
   wherein the emission control semiconductor layer of the emission control transistor is connected to the connection electrode through a contact hole, and
   the trench is provided in a wiring including a semiconductor layer disposed between an emission control gate electrode of the emission control transistor and the contact hole.

3. The display apparatus of claim 1, wherein the trench is provided in a wiring including a semiconductor layer disposed between an emission control semiconductor layer of the emission control transistor and a driving semiconductor layer of the driving transistor.

4. The display apparatus of claim 1, wherein the trench is provided in a wiring including a semiconductor layer disposed between a compensation semiconductor layer of the compensation transistor and a first initialization semiconductor layer of the first initialization transistor.

5. The display apparatus of claim 1, wherein the trench includes a first trench and a second trench,
   the first trench is arranged in one side of the wiring,
   the second trench is arranged in another side of the wiring, and
   the first trench faces the second trench.

6. The display apparatus of claim 1, further comprising a connection wiring arranged inside the pixel circuit,
wherein
the connection wiring connects semiconductor layers apart from each other, and is disposed in a different layer from the semiconductor layers, and
the trench is provided in the connection wiring.

7. The display apparatus of claim 1, further comprising:
a connection electrode connecting an emission control semiconductor layer of the emission control transistor to a pixel electrode of the light-emitting element, and connected to the emission control semiconductor layer through a contact hole; and
a conductive layer disposed between an emission control gate electrode of the emission control transistor and the contact hole, and spaced apart with a preset interval from the emission control gate electrode in a plan view.

8. The display apparatus of claim 1, further comprising:
a connection electrode connecting an emission control semiconductor layer of the emission control transistor to a pixel electrode of the light-emitting element, and connected to the emission control semiconductor layer through a contact hole; and
an inorganic insulating layer in which a first groove is defined between an emission control gate electrode of the emission control transistor and the contact hole.

9. The display apparatus of claim 1, further comprising:
a connection electrode connecting an emission control semiconductor layer of the emission control transistor to a pixel electrode of the light-emitting element, and connected to the emission control semiconductor layer through a contact hole;
a first lower metal layer disposed between the substrate and the emission control semiconductor layer, and overlapping an emission control gate electrode of the emission control transistor; and
a second lower metal layer disposed between the substrate and the emission control semiconductor layer, and overlapping the connection electrode.

10. The display apparatus of claim 1, further comprising a bridge wiring disposed in a different layer from an emission control semiconductor layer of the emission control transistor and connected to the emission control semiconductor layer,
wherein a second groove is provided in an inorganic insulating layer covering the bridge wiring, and
the second groove overlaps the bridge wiring.

11. The display apparatus of claim 1, further comprising:
an inorganic insulating layer arranged in the display area; and
an organic insulating layer disposed between the inorganic insulating layer and the light-emitting element,
wherein a third groove surrounding the pixel circuit is defined in the inorganic insulating layer, and
the organic insulating layer fills the third groove.

12. A display apparatus comprising:
a substrate including a display area;
a pixel circuit arranged on the substrate and including:
a driving transistor;
a compensation transistor;
a first initialization transistor; and
an emission control transistor;
an inorganic insulating layer arranged in the display area;
a light-emitting element arranged on the inorganic insulating layer and connected to the pixel circuit;
a connection electrode connecting an emission control semiconductor layer of the emission control transistor to a pixel electrode of the light-emitting element, and connected to the emission control semiconductor layer through a contact hole; and
a conductive layer disposed between an emission control gate electrode of the emission control transistor and the contact hole, and spaced apart with a preset interval from the emission control gate electrode in a plan view.

13. The display apparatus of claim 12, wherein a first groove is provided in the inorganic insulating layer, and
The first groove being is defined between the emission control gate electrode and the contact hole.

14. The display apparatus of claim 12, further comprising:
a first lower metal layer disposed between the substrate and the emission control semiconductor layer and overlapping the emission control gate electrode; and
a second lower metal layer disposed between the substrate and the emission control semiconductor layer and overlapping the connection electrode.

15. The display apparatus of claim 12, further comprising an organic insulating layer disposed between the inorganic insulating layer and the light-emitting element,
wherein a third groove surrounding the pixel circuit is defined in the inorganic insulating layer, and
the organic insulating layer fills the third groove.

16. The display apparatus of claim 12, wherein the pixel circuit further includes a wiring, and
a trench indented in a width direction of the wiring is defined in at least a portion of the wiring disposed inside the pixel circuit.

17. The display apparatus of claim 16, wherein the trench is provided in the wiring including a semiconductor layer disposed between the emission control gate electrode and the contact hole.

18. The display apparatus of claim 16, wherein the trench is provided in the wiring including a semiconductor layer disposed between the emission control semiconductor layer of the emission control transistor and a driving semiconductor layer of the driving transistor.

19. The display apparatus of claim 16, wherein the trench is provided in the wiring including a semiconductor layer disposed between a compensation semiconductor layer of the compensation transistor and a first initialization semiconductor layer of the first initialization transistor.

20. The display apparatus of claim 16, wherein the trench includes a first trench and a second trench,
the first trench is arranged in one side of the wiring,
the second trench is arranged in another side of the wiring, and
the first trench faces the second trench.

* * * * *